US012200914B2

(12) United States Patent
Turner et al.

(10) Patent No.: US 12,200,914 B2
(45) Date of Patent: Jan. 14, 2025

(54) SMART COMPONENTS, SYSTEMS AND METHODS FOR TRANSFERRING HEAT

(71) Applicant: CoolIT Systems, Inc., Calgary (CA)

(72) Inventors: Cameron Turner, Calgary (CA); Giffin Symko, Calgary (CA)

(73) Assignee: CoolIT Systems, Inc., Calgary (CA)

( * ) Notice: Subject to any disclaimer, the term of this patent is extended or adjusted under 35 U.S.C. 154(b) by 403 days.

(21) Appl. No.: 17/582,987

(22) Filed: Jan. 24, 2022

(65) Prior Publication Data

US 2023/0240053 A1 Jul. 27, 2023

(51) Int. Cl.
*F28D 15/00* (2006.01)
*H05K 7/20* (2006.01)

(52) U.S. Cl.
CPC ..... *H05K 7/20836* (2013.01); *H05K 7/20272* (2013.01); *H05K 7/20281* (2013.01); *H05K 7/20763* (2013.01)

(58) Field of Classification Search
CPC ........... H05K 7/20836; H05K 7/20272; H05K 7/20281; H05K 7/20763
USPC .................................................. 165/104.33
See application file for complete search history.

(56) References Cited

U.S. PATENT DOCUMENTS

| | | |
|---|---|---|
| 2,181,523 A | 11/1939 | Shiels |
| 2,586,248 A | 2/1952 | Newman et al. |
| 2,620,815 A | 12/1952 | Margraf et al. |
| 3,073,385 A | 1/1963 | Martin |
| 3,481,393 A | 12/1969 | Chu |
| 3,730,205 A | 5/1973 | Guimbellot |
| 3,792,284 A | 2/1974 | Kaelin |

(Continued)

FOREIGN PATENT DOCUMENTS

| | | |
|---|---|---|
| CN | 102252488 A | 11/2011 |
| CN | 102483242 A | 5/2012 |

(Continued)

OTHER PUBLICATIONS

Gabriel Torres, CoolIT Water-Cooling Products, http://hardwaresecrets.com/printpage/CoolIT-Water-Cooling-Products/515, Jan. 14, 2008, printed from the web Apr. 24, 2014; 9 pages.

(Continued)

*Primary Examiner* — Davis D Hwu
(74) *Attorney, Agent, or Firm* — WORKMAN NYDEGGER

(57) ABSTRACT

A heat-transfer system includes a cooling circuit configured to convey heated coolant from one or more cooling nodes to one or more heat-rejection devices, and to convey the cooled coolant from the one or more heat-rejection devices to the one or more cooling nodes. Each cooling node facilitates a transfer of heat to the coolant, the heat being from one or more heat-dissipation devices and a corresponding heat load on the respective cooling node. Each heat-rejection device facilitates heat transfer from the coolant to another medium. The heat-transfer system also has a selectively operable flow-control device configured to control a flow rate of the coolant through a segment of the coolant circuit. A control logic selectively operates the flow-control device responsive to an output from one or more sensors to tailor a cooling capacity available to each cooling node to the real-time heat load on the respective cooling node.

16 Claims, 10 Drawing Sheets

(56) References Cited

U.S. PATENT DOCUMENTS

| | | |
|---|---|---|
| 3,817,321 A | 6/1974 | Von Cube et al. |
| 3,838,705 A | 10/1974 | Diehl et al. |
| 3,861,826 A | 1/1975 | Dean, Jr. |
| 3,896,835 A | 7/1975 | Wicke |
| 3,939,328 A | 2/1976 | Davis |
| 4,060,997 A | 12/1977 | Shultz et al. |
| 4,139,330 A | 2/1979 | Neal |
| 4,181,610 A | 1/1980 | Nakamachi et al. |
| 4,340,111 A | 7/1982 | Skala |
| 4,345,643 A | 8/1982 | Dawson et al. |
| 4,450,472 A | 5/1984 | Tuckerman et al. |
| 4,488,566 A | 12/1984 | Hicks |
| 4,495,777 A | 1/1985 | Babington |
| 4,520,298 A | 5/1985 | Abbondanti |
| 4,561,040 A | 12/1985 | Eastman et al. |
| 4,564,040 A | 1/1986 | Rudelick |
| 4,750,086 A | 6/1988 | Mittal |
| 4,758,926 A | 7/1988 | Herell et al. |
| 4,768,581 A | 9/1988 | Gotwald et al. |
| 4,777,578 A | 10/1988 | Jahns |
| 4,898,153 A | 2/1990 | Sherwood |
| 4,909,315 A | 3/1990 | Nelson et al. |
| 4,940,085 A | 7/1990 | Nelson et al. |
| 5,016,090 A | 5/1991 | Galyon |
| 5,018,665 A | 5/1991 | Sulmone |
| 5,070,936 A | 12/1991 | Carroll |
| 5,099,311 A | 3/1992 | Bonde et al. |
| 5,142,214 A | 8/1992 | Purson et al. |
| 5,203,401 A | 4/1993 | Hamburgen et al. |
| 5,218,515 A | 6/1993 | Bernhardt |
| 5,265,670 A | 11/1993 | Zingher |
| 5,277,232 A | 1/1994 | Borsheim |
| 5,294,830 A | 3/1994 | Young et al. |
| 5,309,319 A | 5/1994 | Messina |
| 5,441,102 A | 8/1995 | Burward-Hoy |
| 5,453,641 A | 9/1995 | Mundinger et al. |
| 5,472,008 A | 12/1995 | Boarin |
| 5,522,452 A | 6/1996 | Mizuno et al. |
| 5,535,818 A | 7/1996 | Fujisaki et al. |
| 5,542,445 A | 8/1996 | Adams |
| 5,577,706 A | 11/1996 | King |
| 5,592,363 A | 1/1997 | Atarashi et al. |
| 5,628,199 A | 5/1997 | Hoglund et al. |
| 5,636,653 A | 6/1997 | Titus |
| 5,646,824 A | 7/1997 | Ohashi et al. |
| 5,684,671 A | 11/1997 | Hobbs et al. |
| 5,709,248 A | 1/1998 | Goloff |
| 5,727,618 A | 3/1998 | Mundinger et al. |
| 5,731,954 A | 3/1998 | Cheon |
| 5,823,249 A | 10/1998 | Batchelder |
| 5,835,347 A | 11/1998 | Chu |
| 5,841,634 A | 11/1998 | Visser |
| 5,864,464 A | 1/1999 | Lin |
| 5,875,637 A | 3/1999 | Paetow |
| 5,985,108 A | 11/1999 | Arai |
| 5,998,240 A | 12/1999 | Hamilton et al. |
| 6,019,165 A | 2/2000 | Batchelder |
| 6,024,175 A | 2/2000 | Moore et al. |
| 6,035,655 A | 3/2000 | Hare et al. |
| 6,074,092 A | 6/2000 | Andrews |
| 6,076,557 A | 6/2000 | Carney |
| 6,135,718 A | 10/2000 | Yang |
| 6,256,378 B1 | 7/2001 | Iggulden et al. |
| 6,327,145 B1 | 12/2001 | Lian et al. |
| 6,330,525 B1 | 12/2001 | Hays et al. |
| 6,361,287 B1 | 3/2002 | Hopper |
| 6,408,937 B1 | 6/2002 | Roy |
| 6,415,853 B1 | 7/2002 | Tao et al. |
| 6,415,860 B1 | 7/2002 | Kelly et al. |
| 6,447,270 B1 | 9/2002 | Schmidt et al. |
| 6,470,289 B1 | 10/2002 | Peters et al. |
| 6,611,785 B1 | 8/2003 | Yamanaka et al. |
| 6,702,002 B2 | 3/2004 | Wang |
| 6,725,682 B2 | 4/2004 | Scott |
| 6,748,755 B2 | 6/2004 | Kubo et al. |
| 6,769,258 B2 | 8/2004 | Pierson |
| 6,775,137 B2 | 8/2004 | Chu et al. |
| 6,792,373 B2 | 9/2004 | Tabor |
| 6,679,315 B2 | 10/2004 | Cosley et al. |
| 6,807,056 B2 | 10/2004 | Kondo et al. |
| 6,819,563 B1 | 11/2004 | Chu et al. |
| 6,827,128 B2 | 12/2004 | Philpott et al. |
| 6,868,682 B2 | 3/2005 | Sharma et al. |
| 6,883,347 B2 | 4/2005 | Ayub |
| 6,896,066 B2 | 5/2005 | Gil |
| 6,896,612 B1 | 5/2005 | Novotny |
| 6,900,990 B2 | 5/2005 | Tomioka |
| 6,952,345 B2 | 10/2005 | Weber et al. |
| 6,970,355 B2 | 11/2005 | Ellsworth et al. |
| 6,973,801 B1 | 12/2005 | Campbell et al. |
| 6,993,421 B2 | 1/2006 | Pillar et al. |
| 7,000,684 B2 | 2/2006 | Kenny et al. |
| 7,007,506 B2 | 3/2006 | Kubo et al. |
| 7,012,807 B2 | 3/2006 | Chu |
| 7,021,367 B2 | 4/2006 | Oikawa |
| 7,029,647 B2 | 4/2006 | Tonkovich et al. |
| 7,032,651 B2 | 4/2006 | Winslow et al. |
| 7,044,198 B2 | 5/2006 | Matsushima et al. |
| 7,051,946 B2 | 5/2006 | Bash et al. |
| 7,055,581 B1 | 6/2006 | Roy |
| 7,057,893 B2 | 6/2006 | Nicolai et al. |
| 7,086,247 B2 | 8/2006 | Campbell et al. |
| 7,104,312 B2 | 9/2006 | Goodson et al. |
| 6,986,382 B2 | 10/2006 | Kenny et al. |
| 6,988,534 B2 | 10/2006 | Kenny et al. |
| 7,123,996 B2 | 10/2006 | Fukushima et al. |
| 7,124,811 B2 | 10/2006 | Crocker et al. |
| 7,131,486 B2 | 11/2006 | Goodson et al. |
| 7,143,816 B1 | 12/2006 | Ghosh et al. |
| 7,149,084 B2 | 12/2006 | Matsushima |
| 7,156,159 B2 | 1/2007 | Lovette et al. |
| 7,174,738 B2 | 2/2007 | Scott |
| 7,190,580 B2 | 3/2007 | Bezama et al. |
| 7,201,217 B2 | 4/2007 | Johnson et al. |
| 7,206,203 B2 | 4/2007 | Campbell et al. |
| 7,209,355 B2 | 4/2007 | Koga et al. |
| 7,221,270 B2 | 5/2007 | Chen et al. |
| 7,248,006 B2 | 7/2007 | Bailey et al. |
| 7,259,963 B2 | 8/2007 | Germagian et al. |
| 7,259,965 B2 | 8/2007 | Chang et al. |
| 7,264,359 B2 | 9/2007 | Kawahara et al. |
| 7,274,566 B2 | 9/2007 | Campbell et al. |
| 7,278,273 B1 | 10/2007 | Whitted et al. |
| 7,301,771 B2 | 11/2007 | Hata et al. |
| 7,313,461 B2 | 12/2007 | Sharma et al. |
| 7,313,924 B2 | 1/2008 | Bash et al. |
| 7,315,448 B1 | 1/2008 | Bash et al. |
| 7,318,322 B2 | 1/2008 | Ota et al. |
| 7,331,378 B2 | 2/2008 | Bhatti et al. |
| 7,360,582 B2 | 4/2008 | Olesen |
| 7,397,661 B2 | 7/2008 | Campbell et al. |
| 7,405,935 B1 | 7/2008 | Carey |
| 7,420,804 B2 | 9/2008 | Leija et al. |
| 7,436,666 B1 | 10/2008 | Konshak |
| 7,438,124 B2 | 10/2008 | Bhatti et al. |
| 7,455,103 B2 | 11/2008 | Sato et al. |
| 7,466,549 B2 | 12/2008 | Dorrich et al. |
| 7,466,553 B2 | 12/2008 | Hamman |
| 7,484,530 B2 | 2/2009 | Harvey et al. |
| 7,486,513 B2 | 2/2009 | Hall et al. |
| 7,525,207 B2 | 4/2009 | Clidaras et al. |
| 7,527,085 B2 | 5/2009 | Iijima et al. |
| 7,591,302 B1 | 9/2009 | Lenehan et al. |
| 7,599,184 B2 | 10/2009 | Upadhya et al. |
| 7,630,795 B2 | 12/2009 | Campbell et al. |
| 7,639,499 B1 | 12/2009 | Campbell et al. |
| 7,688,589 B2 | 3/2010 | Chiang |
| 7,756,667 B2 | 7/2010 | Hamann et al. |
| 7,757,506 B2 | 7/2010 | Ellsworth, Jr. et al. |
| 7,762,314 B2 | 7/2010 | Campbell et al. |
| 7,791,882 B2 | 9/2010 | Chu et al. |
| 7,806,168 B2 | 10/2010 | Upadhya et al. |
| 7,874,171 B2 | 1/2011 | Park |
| 7,905,106 B2 | 3/2011 | Attlesey |

(56) References Cited

U.S. PATENT DOCUMENTS

| | | |
|---|---|---|
| 7,925,746 B1 | 4/2011 | Melton |
| 7,944,694 B2 | 6/2011 | Campbell et al. |
| 7,957,132 B2 | 6/2011 | Fried |
| 7,957,144 B2 | 6/2011 | Goettert et al. |
| 7,961,465 B2 | 6/2011 | Goldrian et al. |
| 7,969,727 B2 | 7/2011 | Tozer et al. |
| 7,971,632 B2 | 7/2011 | Eriksen et al. |
| 7,978,472 B2 | 7/2011 | Campbell et al. |
| 7,995,339 B2 | 8/2011 | Bash et al. |
| 8,051,898 B2 | 11/2011 | Chiang |
| 8,066,057 B2 | 11/2011 | Olesen et al. |
| 8,094,453 B2 | 1/2012 | Campbell et al. |
| 8,240,362 B2 | 8/2012 | Eriksen |
| 8,245,764 B2 | 8/2012 | Eriksen |
| 8,250,879 B2 | 8/2012 | Macbain et al. |
| 8,274,787 B2 | 9/2012 | Alyaser et al. |
| 8,289,710 B2 | 10/2012 | Spearing et al. |
| 8,418,487 B2 | 4/2013 | King |
| 8,427,831 B2 | 4/2013 | Wei |
| 8,437,129 B2 | 5/2013 | Tung et al. |
| 8,441,789 B2 | 5/2013 | Wu et al. |
| 8,493,735 B2 | 7/2013 | Iijima |
| 8,493,738 B2 | 7/2013 | Chainer et al. |
| 8,499,761 B2 | 8/2013 | Jorczak et al. |
| 8,631,860 B2 | 1/2014 | Tang et al. |
| 8,687,364 B2 | 4/2014 | Chainer et al. |
| 8,724,315 B2 | 5/2014 | Branton |
| 8,746,330 B2 | 6/2014 | Lyon |
| 8,749,968 B1 | 6/2014 | Branton |
| 8,817,474 B2 | 8/2014 | Campbell et al. |
| 9,043,035 B2 | 5/2015 | Chainer et al. |
| 9,052,252 B2 | 6/2015 | Lyon |
| 9,057,567 B2 | 6/2015 | Lyon |
| 9,069,532 B2 * | 6/2015 | Campbell .......... H05K 7/20809 |
| 9,215,832 B2 | 12/2015 | Chang et al. |
| 9,380,735 B2 | 6/2016 | Chang |
| 9,453,691 B2 | 9/2016 | Lyon |
| 9,496,200 B2 | 11/2016 | Lyon et al. |
| 9,603,284 B2 | 3/2017 | Lyon |
| 9,723,745 B2 | 8/2017 | Qi et al. |
| 9,733,681 B2 | 8/2017 | Eriksen |
| 10,197,176 B2 | 2/2019 | Hathaway et al. |
| 10,335,230 B2 | 7/2019 | Willyard et al. |
| 10,364,809 B2 | 7/2019 | Lyon et al. |
| 10,365,667 B2 | 7/2019 | Lyon et al. |
| 10,690,423 B2 | 6/2020 | Kallosoe et al. |
| 11,661,936 B2 | 5/2023 | Lyon et al. |
| 2001/0020365 A1 | 9/2001 | Kubo et al. |
| 2002/0070007 A1 | 6/2002 | Calaman et al. |
| 2002/0153885 A1 | 10/2002 | Blossfeld |
| 2002/0189790 A1 | 12/2002 | Wong |
| 2003/0010379 A1 | 1/2003 | Kleiner et al. |
| 2003/0019234 A1 | 1/2003 | Wayburn et al. |
| 2003/0070792 A1 | 4/2003 | Tanaka et al. |
| 2003/0085028 A1 | 5/2003 | Galtz |
| 2003/0151130 A1 | 8/2003 | Cheon |
| 2003/0173839 A1 | 9/2003 | Torii et al. |
| 2003/0230400 A1 | 12/2003 | McCordic et al. |
| 2004/0008113 A1 | 1/2004 | Pradhan et al. |
| 2004/0008483 A1 | 1/2004 | Cheon |
| 2004/0016241 A1 | 1/2004 | Street et al. |
| 2004/0040695 A1 | 3/2004 | Chesser et al. |
| 2004/0042171 A1 | 3/2004 | Takamatsu et al. |
| 2004/0042172 A1 | 3/2004 | Kusaka et al. |
| 2004/0057211 A1 | 3/2004 | Kondo et al. |
| 2004/0095721 A1 | 5/2004 | Ellsworth et al. |
| 2004/0100770 A1 | 5/2004 | Chu et al. |
| 2004/0104010 A1 | 6/2004 | Kenny et al. |
| 2004/0104012 A1 | 6/2004 | Zhou et al. |
| 2004/0104022 A1 | 6/2004 | Kenny et al. |
| 2004/0112585 A1 | 6/2004 | Goodson et al. |
| 2004/0123614 A1 | 7/2004 | Stewart |
| 2004/0160741 A1 | 8/2004 | Moss et al. |
| 2004/0182548 A1 | 9/2004 | Lovette et al. |
| 2004/0182560 A1 | 9/2004 | Kenny |
| 2004/0188066 A1 | 9/2004 | Upadhya |
| 2004/0188069 A1 | 9/2004 | Tomioka et al. |
| 2004/0206477 A1 | 10/2004 | Kenny et al. |
| 2004/0221604 A1 | 11/2004 | Ota |
| 2004/0240179 A1 | 12/2004 | Koga et al. |
| 2004/0243280 A1 | 12/2004 | Bash et al. |
| 2004/0250992 A1 | 12/2004 | Aoki et al. |
| 2005/0069432 A1 | 3/2005 | Tomioka |
| 2005/0111187 A1 | 5/2005 | Berens et al. |
| 2005/0126747 A1 | 6/2005 | Chu |
| 2005/0128705 A1 | 6/2005 | Chu |
| 2005/0162280 A1 | 7/2005 | Hayashida et al. |
| 2005/0178531 A1 | 8/2005 | Huang et al. |
| 2005/0180107 A1 | 8/2005 | Naganawa et al. |
| 2005/0205241 A1 | 9/2005 | Goodson et al. |
| 2005/0211417 A1 | 9/2005 | Upadhya |
| 2005/0241809 A1 | 11/2005 | Tomioka et al. |
| 2005/0259397 A1 | 11/2005 | Bash |
| 2005/0269061 A1 | 12/2005 | Brewer et al. |
| 2005/0274115 A1 | 12/2005 | Pearce |
| 2006/0002080 A1 | 1/2006 | Leija |
| 2006/0002088 A1 | 1/2006 | Bezama |
| 2006/0011329 A1 | 1/2006 | Wang et al. |
| 2006/0094347 A1 | 5/2006 | Tracy et al. |
| 2006/0096305 A1 | 5/2006 | Hanzawa et al. |
| 2006/0096738 A1 | 5/2006 | Kang et al. |
| 2006/0096740 A1 | 5/2006 | Zheng |
| 2006/0096743 A1 | 5/2006 | Lee et al. |
| 2006/0126293 A1 | 6/2006 | Campbell et al. |
| 2006/0137863 A1 | 6/2006 | Lee et al. |
| 2006/0143439 A1 | 6/2006 | Arumugam et al. |
| 2006/0162903 A1 | 7/2006 | Bhatti et al. |
| 2006/0168975 A1 | 8/2006 | Malone et al. |
| 2006/0171538 A1 | 8/2006 | Larson et al. |
| 2006/0171801 A1 | 8/2006 | Manabe et al. |
| 2006/0178616 A1 | 8/2006 | Hartman et al. |
| 2006/0185829 A1 | 8/2006 | Duan et al. |
| 2006/0185830 A1 | 8/2006 | Duan |
| 2006/0187638 A1 | 8/2006 | Vinson et al. |
| 2006/0225867 A1 | 10/2006 | Park et al. |
| 2006/0231238 A1 | 10/2006 | Ball |
| 2006/0248159 A1 | 11/2006 | Polan |
| 2006/0254755 A1 | 11/2006 | Chen et al. |
| 2007/0029069 A1 | 2/2007 | Duan |
| 2007/0032979 A1 | 2/2007 | Hamann et al. |
| 2007/0034356 A1 | 2/2007 | Keeny et al. |
| 2007/0039719 A1 | 2/2007 | Eriksen |
| 2007/0078635 A1 | 4/2007 | Rasmussen et al. |
| 2007/0095512 A1 | 5/2007 | Chen et al. |
| 2007/0107886 A1 | 5/2007 | Chen |
| 2007/0125526 A1 | 6/2007 | Satou et al. |
| 2007/0131396 A1 | 6/2007 | Yu et al. |
| 2007/0163750 A1 | 7/2007 | Bhatti et al. |
| 2007/0193724 A1 | 8/2007 | Lin |
| 2007/0227704 A1 | 10/2007 | Nagai et al. |
| 2007/0227710 A1 | 10/2007 | Belady et al. |
| 2007/0256957 A1 | 11/2007 | Herrmann et al. |
| 2007/0272314 A1 | 11/2007 | Packham |
| 2007/0272392 A1 | 11/2007 | Ghosh et al. |
| 2007/0297136 A1 | 12/2007 | Konshak |
| 2008/0029250 A1 | 2/2008 | Carlson et al. |
| 2008/0041792 A1 | 2/2008 | Cmkoich et al. |
| 2008/0053641 A1 | 3/2008 | Lai et al. |
| 2008/0068793 A1 | 3/2008 | Ishimine |
| 2008/0128114 A1 | 6/2008 | Lai et al. |
| 2008/0165499 A1 | 7/2008 | Campbell et al. |
| 2008/0179045 A1 | 7/2008 | Hu et al. |
| 2008/0186670 A1 | 8/2008 | Lyon et al. |
| 2008/0205003 A1 | 8/2008 | Belady |
| 2008/0225478 A1 | 9/2008 | Goettert et al. |
| 2008/0266726 A1 | 10/2008 | Murakami et al. |
| 2008/0288124 A1 | 11/2008 | Huang |
| 2008/0289695 A1 | 11/2008 | Holzer et al. |
| 2008/0301941 A1 | 12/2008 | Anderson, Jr. et al. |
| 2008/0304236 A1 | 12/2008 | Murakami et al. |
| 2008/0314367 A1 | 12/2008 | Goulette et al. |
| 2009/0027856 A1 | 1/2009 | McCoy |
| 2009/0056910 A1 | 3/2009 | Mallia et al. |
| 2009/0071625 A1 | 3/2009 | Lyon |

(56) References Cited

U.S. PATENT DOCUMENTS

| | | |
|---|---|---|
| 2009/0086434 A1 | 4/2009 | Hodes et al. |
| 2009/0090486 A1 | 4/2009 | Geskes et al. |
| 2009/0101315 A1 | 4/2009 | Cheng |
| 2009/0120622 A1 | 5/2009 | Koch |
| 2009/0126910 A1 | 5/2009 | Campbell et al. |
| 2009/0139698 A1 | 6/2009 | Robinson |
| 2009/0154096 A1 | 6/2009 | Iyengar et al. |
| 2009/0199580 A1 | 8/2009 | Lyon |
| 2009/0199582 A1 | 8/2009 | Justin |
| 2009/0218072 A1 | 9/2009 | Erikson |
| 2009/0228893 A1 | 9/2009 | Behrendt et al. |
| 2009/0260777 A1 | 10/2009 | Attlesey |
| 2009/0306833 A1 | 12/2009 | Vinson et al. |
| 2009/0322543 A1 | 12/2009 | Crnkovich et al. |
| 2010/0012294 A1 | 1/2010 | Bezama et al. |
| 2010/0032142 A1 | 2/2010 | Copeland et al. |
| 2010/0065355 A1 | 3/2010 | Reddy |
| 2010/0085708 A1 | 4/2010 | Martin et al. |
| 2010/0101765 A1 | 4/2010 | Campbell |
| 2010/0103619 A1 | 4/2010 | Refai-Ahmed et al. |
| 2010/0103620 A1 | 4/2010 | Campbell |
| 2010/0106464 A1 | 4/2010 | Hlasny et al. |
| 2010/0139887 A1 | 6/2010 | Slessman |
| 2010/0170582 A1 | 7/2010 | Koba et al. |
| 2010/0179695 A1 | 7/2010 | Collins et al. |
| 2010/0182809 A1 | 7/2010 | Cullinane et al. |
| 2010/0206869 A1 | 8/2010 | Nelson et al. |
| 2010/0211669 A1 | 8/2010 | Dalgas et al. |
| 2010/0313576 A1 | 12/2010 | Goenka |
| 2010/0324962 A1 | 12/2010 | Nesler et al. |
| 2010/0326634 A1 | 12/2010 | Eriksen |
| 2011/0008153 A1 | 1/2011 | Kato et al. |
| 2011/0084839 A1 | 4/2011 | Groth et al. |
| 2011/0100045 A1 | 5/2011 | Carlson |
| 2011/0100618 A1 | 5/2011 | Carlson |
| 2011/0115223 A1 | 5/2011 | Stahlkopf et al. |
| 2011/0127027 A1 | 6/2011 | Kashirajima et al. |
| 2011/0154842 A1 | 6/2011 | Heydari et al. |
| 2011/0162742 A1 | 7/2011 | Ulens et al. |
| 2011/0168379 A1 | 7/2011 | Morgan et al. |
| 2011/0174001 A1 | 7/2011 | Carlson et al. |
| 2011/0175498 A1 | 7/2011 | Bash et al. |
| 2011/0303394 A1 | 12/2011 | Branton |
| 2011/0313576 A1 | 12/2011 | Nicewonger |
| 2011/0315407 A1 | 12/2011 | Park et al. |
| 2011/0317367 A1 | 12/2011 | Campbell et al. |
| 2012/0014068 A1 | 1/2012 | Nakanishi et al. |
| 2012/0103009 A1 | 5/2012 | Ding et al. |
| 2012/0147553 A1 | 6/2012 | Eriksen |
| 2012/0152498 A1 | 6/2012 | Lyon |
| 2012/0175094 A1 | 7/2012 | Rice |
| 2012/0176745 A1 | 7/2012 | Helberg et al. |
| 2012/0186790 A1 | 7/2012 | Delia et al. |
| 2012/0271567 A1 | 10/2012 | Da Pont et al. |
| 2012/0273159 A1 | 11/2012 | Eriksen |
| 2012/0300391 A1 | 11/2012 | Keisling et al. |
| 2013/0025818 A1 | 1/2013 | Lyon et al. |
| 2013/0068674 A1 | 3/2013 | Manabe et al. |
| 2013/0092258 A1 | 4/2013 | Yasuda et al. |
| 2013/0107453 A1 | 5/2013 | Chainer et al. |
| 2013/0184927 A1 | 7/2013 | Daniel et al. |
| 2013/0203032 A1 | 8/2013 | Bardsley et al. |
| 2013/0206359 A1 | 8/2013 | Bertilsson et al. |
| 2013/0277008 A1 | 10/2013 | Ishikura et al. |
| 2013/0288630 A1 | 10/2013 | Suzuki |
| 2013/0319650 A1 | 12/2013 | Truemper et al. |
| 2013/0340843 A1 | 12/2013 | Gilmer |
| 2013/0340995 A1 | 12/2013 | David et al. |
| 2014/0018615 A1 | 1/2014 | Lee |
| 2014/0069111 A1 | 3/2014 | Campbell et al. |
| 2014/0103950 A1 | 4/2014 | Janitch |
| 2014/0126147 A1 | 5/2014 | Chen |
| 2014/0141162 A1 | 5/2014 | Wolff et al. |
| 2014/0147289 A1 | 5/2014 | Tian et al. |
| 2014/0158326 A1 | 6/2014 | Lyon |
| 2014/0186156 A1 | 7/2014 | Lai et al. |
| 2014/0245708 A1 | 9/2014 | Kawabe et al. |
| 2014/0251582 A1 | 9/2014 | Lyon |
| 2014/0262180 A1 | 9/2014 | Lyon et al. |
| 2014/0266744 A1 | 9/2014 | Lyon |
| 2014/0332195 A1 | 11/2014 | Liverman |
| 2015/0083368 A1 | 3/2015 | Lyon |
| 2015/0108934 A1 | 4/2015 | Wong et al. |
| 2015/0166362 A1 | 6/2015 | Govindan et al. |
| 2015/0168474 A1 | 6/2015 | Yoshioka et al. |
| 2015/0176931 A1 | 6/2015 | Aeberhard et al. |
| 2015/0355630 A1 | 12/2015 | Cader |
| 2016/0281704 A1 | 9/2016 | Lyon |
| 2016/0290216 A1 | 10/2016 | Katragadda et al. |
| 2016/0377355 A1 | 12/2016 | Lyon |
| 2017/0030228 A1 | 2/2017 | Jordan, Jr. et al. |
| 2017/0064874 A1 | 3/2017 | Lyon et al. |
| 2017/0068258 A1 | 3/2017 | Lyon et al. |
| 2017/0147289 A1 | 5/2017 | Exall et al. |
| 2017/0196116 A1 | 7/2017 | Lyon |
| 2017/0219241 A1 | 8/2017 | Magcal et al. |
| 2019/0039437 A1 | 2/2019 | Jentz et al. |
| 2019/0116694 A1 | 4/2019 | Lyon |
| 2019/0353370 A1 | 11/2019 | Hern et al. |
| 2019/0354121 A1 | 11/2019 | Lyon et al. |
| 2019/0368832 A1 | 12/2019 | Huang et al. |
| 2020/0004156 A1 | 1/2020 | Hsieh et al. |
| 2020/0025641 A1 | 1/2020 | Long et al. |
| 2020/0271237 A1 | 8/2020 | Srinivasa |
| 2020/0348202 A1 | 11/2020 | Farkas et al. |

FOREIGN PATENT DOCUMENTS

| | | |
|---|---|---|
| CN | 103419937 A | 12/2013 |
| CN | 106958978 A | 7/2017 |
| CN | 206930036 U | 1/2018 |
| CN | 207702811 U | 8/2018 |
| DE | 202012002974 U1 | 7/2012 |
| EP | 1808892 | 7/2007 |
| JP | 61032449 | 2/1986 |
| JP | 02-287076 A | 11/1990 |
| JP | H03-17443 | 1/1991 |
| JP | 03-179086 A | 8/1991 |
| JP | 06120387 | 4/1994 |
| JP | 07-183678 A | 7/1995 |
| JP | 09292099 | 11/1997 |
| JP | 10-173114 A | 6/1998 |
| JP | 11-316075 A | 11/1999 |
| JP | 2001-255027 A | 9/2001 |
| JP | 2002151638 | 5/2002 |
| JP | 2003-243581 A | 8/2003 |
| JP | 2005-351600 A | 12/2005 |
| JP | 2007180505 | 7/2007 |
| JP | 2007227902 | 9/2007 |
| JP | 2007531991 | 11/2007 |
| JP | 2008-140879 A | 6/2008 |
| JP | 2009-529621 A | 8/2009 |
| JP | 2011-114206 A | 6/2011 |
| JP | 3179086 U | 10/2012 |
| TW | M273031 | 8/2005 |
| TW | M298733 | 8/2005 |
| TW | I266039 B | 11/2006 |
| TW | 201305522 A | 2/2013 |
| TW | 201320883 A | 5/2013 |
| TW | 201441626 A | 11/2014 |
| TW | I531795 B | 5/2016 |
| TW | I540955 B | 7/2016 |
| TW | I606224 B | 11/2017 |
| TW | M587771 U | 12/2019 |
| WO | 0165900 | 9/2001 |
| WO | 03055055 | 7/2003 |
| WO | 2005/017468 A2 | 2/2005 |
| WO | 2005096377 | 10/2005 |
| WO | 2006052317 | 5/2006 |
| WO | 2006119761 | 11/2006 |
| WO | 2007/029253 A2 | 3/2007 |

(56) References Cited

FOREIGN PATENT DOCUMENTS

| WO | 2010054786 | 5/2010 |
|---|---|---|
| WO | 2014/141162 A1 | 9/2014 |

OTHER PUBLICATIONS

Michael J. Ellsworth, Jr. P.E., Thermal Design and Implementation of Robust Liquid Cooling Systems for High Performance Computer Systems, Systems Technology Group, IBM, InterPACK '11, Jul. 6-8, 2011.
Roger R. Schmidt, Liquid Cooling is Back, Aug. 1, 2005; https://www.electronics-cooling.com/2005/08/liquidcooling-is-back/; 8 pages.
Ellsworth, Jr. et al., The Evolution of Water Cooling for IBM Large Server Systems: Back to the Future, IEEE, 2008, 9 pages.
Vert Al, L., Water Cooling Comes of Age, Again, Asetek Data Center Uqt,id Cooling, Published on Oct. 11, 2013, Retrieved from the Internet URL: https://ww,v.asetek.com/press-room/blog/2013/water-cooling-comes-of-age-again/, on Jan. 4, 2018, pp. 1-10.
US 7,468,581, 09/1988, Gotwald et al. (withdrawn)
CPU-360 Water Block (AMD/Intel Processor). Rev 1.1, Koolance, (https://koolance.com/cpu-360-processor-water-block) last accessed on Oct. 30, 2020, 1 page.
Hilbert Hagedoom, "Aseteck Waterchill Watercooling—p. 1—a Chill Introduction," Guru3D.com, Feb. 28, 2005, (https://www.guru3d.com/articles-pages/asetek-waterchill-watercooling) last accessed on Nov. 3, 2020, 25 pages.
Hilbert Hagedoom, "Koolance CPU-360 Waterblock," Guru.com, Feb. 9, 2010, (https://www.guru3d.com/news-story/koolance-cpu-360-waterblock), last accessed on Nov. 3, 2020, 2 pages.
Matthew Homan, "WaterChill By Asetek," TechwareLabs, LLC, Dec. 11, 2004, (http://www.techwarelabs.com/reviews/cooling/asetek_waterchill/) last accessed on Oct. 30, 2020 3 pages.
3DGAMEMAN, "#530—Asetek WaterChill2 Water Cooling Kit," YouTube, Jul. 16, 2006, (https://www.youtube.com/watch?v=6OXNAXO9cxY) last accessed on Oct. 30, 2020.
3DGAMEMAN, "#596—Asetek Xtreme WaterChill Water Cooling Kit," YouTube, Jul. 17, 2006, (https://www.youtube.com/watch?v=Z9XSJBCJttU) last accessed on Oct. 29, 2020.
Adrian Willson, "(1080) Koolance CPU 360 CPU Waterblock Review," YouTube, Mar. 14, 2010, (https://www.youtube.com/watch?v=hhWP7rF1uQs) last accessed on Oct. 30, 2020.
Super1080p, "(1080) Koolance CPU 360 CPU Waterblock Review," YouTube, Mar. 17, 2010, (https://www.youtube.com/watch?v=3kg4Yvl1XLU) last accessed on Oct. 30, 2020.
"WaterChill CPU Cooler Antarctica For Intel Socket 478, AMD Docket A/754/940," Apr. 13, 2004, 14 pages, Version 4.0, Asetek, Inc.
"WaterChill CPU Cooler Antarctica For Intel Socket 478, AMD Docket 462/754/940," Jun. 4, 2004, 9 pages, Version 4.1, Asetek, Inc.
"WaterChill CPU Cooler Antarctica For Intel Socket 478, AMD Docket A/754/940," Mar. 30, 2004, 2 pages, Version 4.0, Asetek, Inc.
"WaterChill CPU Cooler Antarctica Pour Port Intel Socket 478, AMD Docket 462/754/940," Jun. 4, 2004, 10 pages, Version 4.0, Asetek, Inc.
"WaterChill CPU-Kühler Antarctica Für Intel Socket 478, AMD Docket 462/754/940," Jun. 4, 2004, 10 pages, Version 4.0, Asetek, Inc.
Refrigerador de CPUs WaterChill Antarctica Para Intel Socket 478, AMD Socket 462/754/940, Jun. 4, 2004, 9, pages, Version 4.0, Asetek, Inc.
"WaterChill CPU-Kühler Antarctica Für Intel Socket 478, AMD Docket 462/754/939/940," Jun. 4, 2004, & Oct. 18, 2004, 9 pages, Version 4.0 & 4.1, Asetek, Inc.
"WaterChill CPU Cooler Antarctica For Intel Socket 478, AMD Socket 462/754/939/940," Jun. 4, 2004 & Oct. 18, 2004, 9 pages, Version 4.0 & 4.1, Asetek, Inc.

"Refrigerador de CPUs WaterChill Antarctica Para Intel Socket 478, AMD Socket 462/754/939/940," Jun. 4, 2004 and Oct. 18, 2004, 9, pages, Version 4.0 & 4.1, Asetek, Inc.
"WaterChill CPU Cooler Antarctica Pour Port Intel Socket 478, AMD Docket 462/754/939/940," Jun. 4, 2004 & Oct. 18, 2004, 10 pages, Version 4.0 & 4.1, Asetek, Inc.
Dave Altavilla, "Asetek Antarctica WaterChill Water Cooling Kit.," HotHardware.com, Jun. 8, 2004, (https://hothardware.com/reviews/asetek-antarctica-waterchill-water-cooling-kit) last accessed on Nov. 3, 2020, 7 pages.
Rob Darby, "Internal Flow Applications," Chemical Engineering Fluid Mechanics, 2001, pp. 195-238, Chapter 7, Marcel Dekker, Inc., New York, NY.
John S. Scott, "Header" and "Manifold," Dictionary of Civil Engineering, 4th Edition, 1993, pp. 211 and 269, Van Nostrand Reinhold, New York, NY.
"Asetek WaterChill" Techspot, Mar. 14, 2006 (https://www.techspot.com/community/topics/asetek-waterchill.46119/), last accessed Sep. 30, 2021, 7 pages.
"Asetek Antarctica Waterblock" Overlookers, Feb. 28, 2004 (https://www.overclockers.com/asetek-antarctica-waterblock/) last accessed, Sep. 30, 2021, 6 pages.
"Asetek Antarctica WaterChill CPU Cooling Kit Review," Overclocker Club, Apr. 25, 2004 (https://www.overclockersclub.com/reviews/asetek/5.htm) last accessed Sep. 30, 2021.
Altavilla, Dave, "Asetek Antarctica WaterChill Water Cooling Kit" Hot Hardware, Inc., Jun. 8, 2004, 4 pages (https://hothardware.com/reviews/asetek-antarctica-waterchill-water-cooling-kit) last accessed Sep. 30, 2021.
Ryszard Sommefeldt, "Review: Asetek WaterChill Antarctica KT03A-L30," HEXUS.net, Aug. 2, 2004, 3 pages (https://m.hexus.net/tech/reviews/cooling/791-asetek-waterchill-antarctica-kt03a-130/?page=2) last accessed Sep. 30, 2021.
"Asetek Reviews" TechPowerUp Review Database (https://www.techpowerup.com/reviewdb/Cooling/Water/Asetek/) last accessed Sep. 30, 2021, 3 pages.
"Asetek WaterChill Antarctica Water Cooling Kit," Asetek, (https://www.extremeoverclocking.com/reviews/cooling/WaterChill_Antarctica_1.html) last accessed on Oct. 30, 2020, 11 pages.
Advisory Action for U.S. Appl. No. 13/559,340, mailed Dec. 2, 2015, 4 pages.
Advisory Action for U.S. Appl. No. 14/283,163, mailed Aug. 30, 2015, 3 pages.
Cool 'n' Quiet Technology Installation Guide for AMD Athlon 64 Processor Based Systems, Revision 0.04, Advanced Micro Devices, Inc., Jun. 2004.
Data Center Thermal Zone Mapping, Hewlett-Packard Development Company, LP, Ferrer, et al., 4AA1-5481ENW, Sep. 2007.
Decision Instituting Inter Partes Review, IPR No. 2019-00705, entered Sep. 6, 2019, 22 pages.
Declaration of Donald E. Tilton, PH.D, (including his CV) from Petition for Inter Parties Review of U.S. Pat. No. 9,496,200 in Asetek DenmarkA/S/v. CoolIT Systems, Inc. IPR No. 2019-00705, dated Mar. 1, 2019 76 pages.
Declaration of Dr. Donald Tilton (including his CV) from Petition for Inter Parties Review of U.S. Pat. No. 8,746,330 in *Asetek Danmark A/S v. CoolIT Systems Inc.*, dated May 27, 2015.
Declaration of Steven B. Branton, from Petition for Inter Parties Review of U.S. Pat. No. 9,496,200, in *Asetek Denmark A/S/ v. CoolIT Systems, Inc.* IPR No. 2019-00705, dated Feb. 26, 2019 7 pages.
Electronic-Actuated Valves, Direct Industry, Available at https://www.directindustry.com/industrial-manufacturer/electrically-actuated-valve-1 18189.html (last visited Mar. 26, 2022).
English Translation of Examination and Search Report for Taiwan Application No. 103109612, mailed Jan. 1, 2015, 9 pages.
English Translation of Examination and Search Reporter Taiwan Application No. 101127180, dated May 21, 2015, 7 pages.
English translation of Examination Report in Taiwan Application No. 101110072, mailed Feb. 8, 2017.
English Translation of Notice of Allowance in Taiwan Application No. 101110072, mailed Aug. 17, 2017.

(56) References Cited

OTHER PUBLICATIONS

English Translation of Notice of Allowance in Taiwan Application No. 101127180, mailed Feb. 19, 2016, 3 pages.
English Translation of Notice of Allowance in Taiwan Application No. 103109612, mailed Dec. 11, 2015, 3 pages.
English Translation of Office Action in Japanese Application No. 2012-002117, mailed May 7, 2012.
English translation of Second Technical Opinion for Japanese Utility Model Application No. 2012-002117 mailed Jul. 19, 2013 (Registration No. 3179086).
English translation of Technical Opinion for Japanese Utility Model Application No. 2012-002117, mailed Jan. 10, 2013 (Registration No. 3179086).
English Translation Search and Exam reports for Taiwanese Application No. 101110072, mailed Apr. 9, 2014, 40 pages.
Ex Parte Quayle Action for U.S. Appl. No. 14/210,165, mailed Feb. 5, 2015, 5 pages.
Exam Report for European Application No. 07075014.6, mailed Mar. 11, 2011, 9 pages.
Feng Cui, Minglu Zhang, Lingyu Sun, "Design of GPS/MM/GPRS Integrated Location System for the Mobile Robot" IEEE 2006, 6 pages.
Final Office Action for U.S. Appl. No. 14/283,163, mailed Jun. 15, 2016, 12 pages.
Final Office Action for U.S. Appl. No. 12/189,476 dated Jan. 7, 2013; 10 pages.
Final Office Action in U.S. Appl. No. 15/354,928, dated Oct. 9, 2018, 9 pages.
Final Office Action in U.S. Appl. No. 16/525,303, dated Nov. 30, 2021, 20 pages.
Final Office Action in U.S. Appl. No. 17/079,225, dated Sep. 23, 2021, 6 pages.
Final Office Action in U.S. Appl. No. 11/745,932, mailed Aug. 30, 2010, 12 pages.
Final Office Action in U.S. Appl. No. 11/745,932, mailed Feb. 3, 2012, 12 pages.
Final Office Action in U.S. Appl. No. 13/401,618, mailed Jan. 26, 2016, 23 pages.
Final Office Action in U.S. Appl. No. 13/559,340, mailed Sep. 8, 2015, 13 pages.
Final Office Action in U.S. Appl. No. 14/283,163, mailed May 14, 2015, 15 pages.
Final Office Action in U.S. Appl. No. 14/550,952, mailed Oct. 20, 2015, 15 pages.
Final Office Action in U.S. Appl. No. 14/777,510, mailed Jul. 30, 2018, 23 pages.
Final Office Action in U.S. Appl. No. 15/354,982, mailed Oct. 9, 2018, 9 pages.
Final Office Action in U.S. Appl. No. 15/462,753, mailed Sep. 15, 2017, 14 pages.
Final Written Decision, IPR2019-00705, Paper 43 (P.T.A.B. Aug. 21, 2020) (dismissing Petition and determining No. challenged claims in U.S. Pat. No. 9,496,200 unpatentable).
H.F. Hamann, et al., "Uncovering Energy-Efficiency Opportunities in Data Centers," IBM 2009, pp. 10:1-10:12.
Hilbert Hagedoom, "Aseteck Waterchill Watercooling—p. 1—a Chill Introduction," Guru3D.com, Feb. 28, 2005, 25 pages.
http://www.asetek.com/press-room/blog/2013/water-cooling-comes-of-age-again/ (Oct. 11, 2013; last visited Nov. 9, 2015; accompanying as Exhibit A).
International Preliminary Report on Patenability in PCT Application No. PCT/182014/059768, mailed Sep. 15, 2015 9 pages.
International Preliminary Report on Patenability received for PCT Patent Application No. PCT/IB2018/057907, mailed on Apr. 23, 2020, 6 pages.
International Preliminary Report on Patentability received for PCT Patent Application No. PCT/IB2023/050552 , mailed on Aug. 8, 2024, 7 pages.
International Search Report and Written Opinion in PCT Application No. PCT/182014/059768, mailed Jul. 9, 2014, 17 pages.
International Search Report and Written Opinion received for PCT Patent Application No. PCT/IB2018/057907, mailed on Jan. 23, 2019, 9 pages.
International Search Report and Written Opinion received for PCT Patent Application No. PCT/IB2023/050552, mailed on May 9, 2023, 10 pages.
Invitation to Pay Additional Fee received for PCT Patent Application No. PCT/IB2018/057907, mailed on Nov. 14, 2018, 2 pages.
Kandlikar, S.G., "High Flux Heat Removal with Microchannels. A Roadmap of Challenges and Opportunities, " Heat Transfer Engineering. vol. 26 No. 8 : 5-14, (2005), pp. 5-14.
Knight, R.W., et al., "Heat Sink Optimization with Application to Microchannels," IEEE Transactions on Components, Hybrids, and Manufacturing Technology, vol. 15, No. 5, Oct. 1992, pp. 832-842.
Restriction Requirement for U.S. Appl. No. 14/283,163, mailed Jun. 13, 2014.
Restriction Requirement for U.S. Appl. No. 12/189,476, mailed on Jan. 24, 2012.
Schmidt, R.R., "Liquid Cooling is Back," Electronics Cooling Magazine, Published Aug. 1, 2005, Retrieved from the Internet URL: https://www.electronics-cooling.com/2005/08/liquid-cooling-is-back/, on Apr. 30, 2014, pp. 1-7.
Steinke, M., and Kandlikar, S.G., "Single-Phase Heat Transfer Enhancement Techniques In Microchannel and Minichannels Flows," Microchannels and Minichannels—2004, published on Jun. 17-19, 2004, Rochaster, New York, pp. 1-8.
Third Party Submission Under 37 CFR 1290 in U.S. Appl. No. 13/559,340 from Eric Raciti, dated Jan. 9, 2015; 13 pages.
TW OA with English Translation for TW 112103044 dated Oct. 17, 2023.
USPTO Patent Trial and Appeal Board Final Written Decision in Case IPR2015-01276, mailed Dec. 8, 2016.
Merriam-webster definition of beveled, dated Jan. 26, 2016, retrieved from internet URL: http://www.merriam-webster.com/dictionary/beveled, pp. 1-4.
Non-Final Office Action for U.S. Appl. No. 14/210,165, Sep. 29, 2014, 16 pages.
Non-Final Office Action for U.S. Appl. No. 16/525,303, mailed Mar. 19, 2021, 13 pages.
Non-Final Office Action for U.S. Appl. No. 14/183,443, mailed Oct. 30, 2014.
Non-Final Office Action for U.S. Appl. No. 14/550,952, mailed Jul. 7, 2015.
Non-Final Office Action in U.S. Appl. No. 16/158,227, dated May 19, 2021, 20 pages.
Non-Final Office Action in U.S. Appl. No. 11/745,932, mailed Jan. 25, 2010, 16 pages.
Non-Final Office Action in U.S. Appl. No. 11/745,932, mailed Jul. 2, 2012, 14 pages.
Non-Final Office Action in U.S. Appl. No. 11/745,932, mailed Mar. 28, 2011, 11 pages.
Non-Final Office Action in U.S. Appl. No. 13/401,618, mailed Jul. 28, 2015, 20 pages.
Non-Final Office Action in U.S. Appl. No. 13/559,340, mailed Jan. 15, 2016, 22 pages.
Non-Final Office Action in U.S. Appl. No. 13/559,340, mailed Mar. 26, 2015, 12 pages.
Non-Final Office Action in U.S. Appl. No. 13/776,673, mailed Jul. 11, 2013, 19 pages.
Non-Final Office Action in U.S. Appl. No. 14/217,080, mailed Mar. 9, 2017, 11 pages.
Non-Final Office Action in U.S. Appl. No. 14/283,163, mailed Sep. 30, 2014, 10 pages.
Non-Final Office Action in U.S. Appl. No. 14/283,163, mailed Sep. 4, 2015, 15 pages.
Non-Final Office Action in U.S. Appl. No. 14/777,510, mailed Apr. 23, 2018, 23 pages.
Non-Final Office Action in U.S. Appl. No. 14/777,510, mailed Oct. 11, 2017.
Non-Final Office Action in U.S. Appl. No. 15/263,210, mailed Feb. 10, 2017, 5 pages.
Non-Final Office Action in U.S. Appl. No. 15/351,362, mailed Feb. 7, 2019, 20 pages.

(56) References Cited

OTHER PUBLICATIONS

Non-Final Office Action in U.S. Appl. No. 15/351,362, mailed Nov. 18, 2019, 12 pages.
Non-Final Office Action in U.S. Appl. No. 15/354,982, mailed May 8, 2018, 19 pages.
Non-Final Office Action in U.S. Appl. No. 15/462,753, mailed May 11, 2017, 11 pages.
Notice of Allowance for U.S. Appl. No. 13/401,618, mailed Jul. 27, 2016, 10 pages.
Notice of Allowance for U.S. Appl. No. 13/559,340, mailed Sep. 23, 2016, 10 pages.
Notice of Allowance for U.S. Appl. No. 14/183,443, mailed Apr. 30, 2015.
Notice of Allowance in U.S. Appl. No. 12/189,476, mailed Apr. 28, 2014.
Notice of Allowance in U.S. Appl. No. 14/210,165, mailed Feb. 20, 2015, 7 pages.
Notice of Allowance in U.S. Appl. No. 14/217,080, mailed Nov. 1, 2017, 8 pages.
Notice of Allowance in U.S. Appl. No. 15/263,210, mailed Oct. 30, 2017, 14 pages.
Notice of Allowance in U.S. Appl. No. 14/283,163, mailed Jan. 19, 2017, 17 pages.
Office Action for Taiwan Application No. 103109612, mailed Sep. 21, 2015, 2 pages.
Office Action for U.S. Appl. No. 12/189,476 dated Apr. 13, 2012; 17 pages.
Osinski, USPTO Decision of Institution of Inter Parties Review, filed Dec. 9, 2015 in Case IPR2015-01276.
Patent Owner's Preliminary Response of U.S. Pat. No. 9,496,200, United States Patent and Trademark Office, Before the Patent and Trial Appeal Board, *Asetek Denmark A/S* v. *CoolIT Systems, Inc.*, IPR No. 2019-00705, filed Jun. 13, 2019, 29 pages.
Patent Owner's Surreply in Support of Patent Owner's Preliminary Response of U.S. Pat. No. 9,496,200, United States Patent and Trademark Office, Before the Patent and Trial Appeal Board, *Asetek Denmark A/S* v. *CoolIT Systems, Inc.*, IPR No. 2019-00705, filed on Jul. 12, 2019, 6 pages.
Petition for Inter Partes Review of U.S. Pat. No. 8,749,968; United States Patent and Trademark Office, Before the Patent Trial and Appeal Board, *CoolIT Systems, Inc.* v. *Asetek A/S*, Inter Parties Review No. 2014-01172, Jul. 16, 2014, 61 pages.
Petition for Inter Partes Review of U.S. Pat. No. 9,496,200, United States Patent and Trademark Office, Before the Patent and Trial Appeal Board, *Asetek Denmark A/S* v. *CoolIT Systems, Inc.*, IPR No. 2019-00705, filed Mar. 4, 2019, 73 pages.
Petition for Inter Parties Review of U.S. Pat. No. 8,746,330 in *Asetek Danmark A/S* v. *CoolIT Systems Inc*. filed May 27, 2015.
Petitioner's Reply to Patent Owner's Preliminary Response of U.S. Pat. No. 9,496,200, United States Patent and Trademark Office, Before the Patent and Trial Appeal Board, *Asetek Denmark A/S* v. *CoolIT Systems, Inc.*, IPR No. 2019-00705, filed Jun. 28, 2019, 7 pages.
Pollard, United States Patent and Trademark Office Patent Owner's Response. Filed Mar. 9, 2016 in Case IPR2015-01276.
Pollard, United States Patent and Trademark Office Patent Owner's Response. Filed Mar. 9, 2016 in Case PR2015-01276.
Preissuance submission for U.S. Appl. No. 13/401,618, mailed Jan. 9, 2015.
Restriction Requirement for U.S. Appl. No. 13/401,618, mailed Sep. 18, 2014, 8 pages.
Restriction Requirement for U.S. Appl. No. 13/559,340, mailed Oct. 31, 2014, 10 pages.
Restriction Requirement for U.S. Appl. No. 14/210,165, mailed Jun. 12, 2014, 5 pages.
Restriction Requirement for U.S. Appl. No. 14/217,080, mailed Sep. 21, 2016, 5 pages.
Restriction Requirement for U.S. Appl. No. 14/283,163, mailed Jun. 13, 2014, 6 pages.
Restriction Requirement for U.S. Appl. No. 14/550,952, mailed Feb. 5, 2015, 6 pages.
Restriction Requirement for U.S. Appl. No. 14/183,443, mailed May 22, 2014.

\* cited by examiner

CoolIT SYSTEMS™
Rack DCLC Sizing Tool

Rev: A01, By: AA
Date: February 22, 2019

[Calculate] [Clear Inputs]

| Inputs | | |
|---|---|---|
| Heat Exchanger | CHx750 | |
| Facility Water Flow Rate | 300 | LPM |
| T primary, in | 45.0 | °C |
| Number of Rack Manifolds | 15 | |
| Number of Stations Per Manifold | 42 | |
| Server Quick Connect | SCG03 | |
| Manifold Quick Connect | CGB20 | |
| Server Tubing Type | IIR | |
| Total Server Tubing Length | 2.00 | m |
| Pressure Drop Safety Factor | 20% | |
| Specify Pump Operating Speed (%) | 100% | |

| Component Name | Component | Heat Load (W) | Tcase, max (°C) | Total Heat Load (W) | Flow (LPM) | TR (°C/W) | Tcase (°C) | Tcoolant, out (°C) | Difference from Tcase, max (°C) | # of Components | # Dies | No. Flow Splits From | Flow Comes From Which Preceding Component? | Calculate ΔP? |
|---|---|---|---|---|---|---|---|---|---|---|---|---|---|---|
| First CPUs | RX | 205 | 80 | 820 | 0.77 | 0.0444 | 76.3 | 71.1 | -3.7 | | 2 | 2 | | Yes |
| Second CPUs | RX | 205 | 80 | 820 | 0.77 | 0.0444 | 80.2 | 75.0 | 0.2 | | 2 | 2 | | Yes |

SMART COMPONENTS, SYSTEMS AND METHODS FOR TRANSFERRING HEAT

CROSS-REFERENCE TO RELATED APPLICATIONS

Pertinent disclosures include, by way of example, U.S. Pat. No. 9,052,252, issued Jun. 9, 2015, U.S. Pat. No. 10,364,809, issued Jul. 30, 2019, U.S. Pat. No. 10,365,667, issued Jul. 30, 2019. Each of the foregoing references is hereby incorporated by reference in its entirety as if fully set forth herein, for all purposes.

FIELD

This application and the subject matter disclosed herein (collectively referred to as the "disclosure"), generally concern liquid-based heat-transfer systems. More particularly, but not exclusively, this disclosure pertains to systems, methods, and components for cooling electronics.

BACKGROUND INFORMATION

Component and overall heat dissipation, together with computing performance, increases with each successive generation of server (including each successive generation of processing component, power-delivery component, chipset component, memory controller component, memory component, and other components) within those servers. Consequently, liquid-cooling technologies have become desirable within data centers and other computing installations for their ability to efficiently remove heat dissipated by processing units and other server components.

SUMMARY

Notwithstanding that component and overall heat dissipation may increase for each successive generation of server or component, not all servers and components operate at full capacity throughout their useful life. Rather, heat dissipation by a given server (and by each component within the server) typically varies according to the workload the server (or the component) is called to perform (sometimes referred to generally in the art as an "IT workload"). In some respects, disclosed principles pertain to tailoring a liquid-cooling system to match an expected IT workload. In other respects, disclosed principles pertain to adjusting operation of liquid-cooling system in real-time to match an observed or inferred IT workload. By tailoring or adjusting operation of liquid-cooling systems to correspond to observed, expected or inferred IT workloads, relatively high over-all system efficiency can be achieved, as unnecessary excess cooling can be avoided.

A heat-transfer system includes a cooling circuit configured to convey heated coolant from one or more cooling nodes to one or more heat-rejection devices, and to convey the cooled coolant from the one or more heat-rejection devices to the one or more cooling nodes. Each cooling node facilitates a transfer of heat to the coolant, the heat being from one or more heat-dissipation devices and a corresponding heat load on the respective cooling node. Each heat-rejection device facilitates heat transfer from the coolant to another medium. The heat-transfer system also has a selectively operable flow-control device configured to control a flow rate of the coolant through a segment of the coolant circuit. A control logic selectively operates the flow-control device responsive to an output from one or more sensors to tailor a cooling capacity available to each cooling node to the real-time heat load on the respective cooling node.

The coolant in the cooling circuit can be a facility coolant. At least one of the one or more cooling nodes can include a coolant heat-exchange unit configured to transfer heat from a secondary coolant to the facility coolant, cooling the secondary coolant. The heat-transfer system can also include a secondary cooling circuit having a plurality of server-cooling nodes. A secondary distribution manifold can be configured to distribute the secondary coolant among the plurality of server-cooling nodes. A secondary collection manifold can be configured to collect the secondary coolant from the plurality of server-cooling nodes. The coolant heat-exchange unit can fluidicly couple with the secondary collection manifold to receive heated secondary coolant from the plurality of server-cooling nodes. The coolant heat-exchange unit can fluidicly couple with the secondary distribution manifold to distribute cooled secondary coolant among the plurality of server-cooling nodes.

The coolant heat-exchange unit can be a first coolant heat-exchange unit and the secondary cooling circuit can be a first secondary cooling circuit. At least one of the one or more cooling nodes can include a second coolant heat-exchange unit and the heat-transfer system can further include a second secondary cooling circuit cooled by the facility coolant.

The one or more cooling nodes can include one or more component-cooling nodes corresponding to each of a plurality of servers. Each component-cooling node can be configured to transfer heat from a processing unit to the coolant. The one or more heat-rejection devices can include a coolant heat-exchange unit configured to transfer heat from the coolant to a facility coolant.

The selectively operable flow-control device can include an adjustable valve. The selectively operable flow-control device can include a controllable pump.

The one or more heat-rejection devices can include a waste-heat recovery device configured to transfer heat from the coolant to another working fluid.

The heat-transfer system can also include a gateway having a first communication connection with the control logic, the plurality of sensors, or both. The gateway can also include a second communication connection with a Data Center Information Manager, a Building Management System, or both. In some embodiments, the gateway is configured to receive first information over the first communication connection and to communicate the received first information over the second communication connection, to receive second information over the second communication connection and to communicate the received second information over the first communication connection, or both.

In some embodiments, the first received information can correspond to a measure of cooling margin available from the heat-transfer system. In some embodiments, the second received information corresponds to an IT workload scheduled for one or more servers. For example, the heat load on the respective cooling node can correspond to the IT workload.

According to other aspects, a heat-transfer system includes a plurality of cooling nodes. Each cooling node is configured to directly or indirectly transfer heat to a coolant. The transferred heat is generated by one or more electronic components corresponding to each cooling node. A flow controller is configured to control a flow rate of coolant to a selected one or more of the plurality of cooling nodes in correspondence with a real-time determination of the heat generated by the one or more electronic components that correspond to the selected one or more of the plurality of cooling nodes.

In some embodiments, the heat-transfer system also includes a communication gateway configured to receive information from the flow controller and to communicate the information to a Building Management System, a Data Center Information Manager, or both. For example, in some embodiments, the heat-transfer system includes a plurality of sensors. Each sensor in the first plurality of sensors can be configured to observe a corresponding one or more parameters of a selected one of the plurality of cooling nodes. The communication gateway can be configured to determine a state of-operational-health of the selected cooling node from the one or more parameters observed by the plurality of sensors. The communication gateway can be further configured to communicate an indication of the state of-operational-health to the Building Management System, the Data Center Information Manager, or both.

In some embodiments, the communication gateway is configured to receive information from the Building Management System, the Data Center Information Manager, or both. In some embodiments, the communication gateway can also be configured to communicate the information to the flow controller. For example, the flow controller can be configured to control the flow rate of coolant to the selected one or more of the plurality of cooling nodes responsive to information received from the communication gateway.

In some embodiments, the flow controller is configured to isolate one of the one or more of the plurality of cooling nodes responsive to information received from the communication gateway. For example, information received from the communication gateway can correspond to information received by the gateway from the Building Management System, the Data Center Information Manager, or both. Such received information can indicate a leak or other system operating fault.

In some embodiments, a real-time determination of a generated heat load to be cooled corresponds to information received from the Building Management System, the Data Center Information Manager, or both.

In some embodiments, the flow controller includes a control logic and a flow-control device. For example, the flow-control device comprises a valve, a pump, or both.

Also disclosed are associated methods, as well as tangible, non-transitory computer-readable media including computer executable instructions that, when executed, cause a computing environment to implement one or more methods disclosed herein. Digital signal processors embodied in software, firmware, or hardware and being suitable for implementing such instructions also are disclosed.

The foregoing and other features and advantages will become more apparent from the following detailed description, which proceeds with reference to the accompanying drawings.

BRIEF DESCRIPTION OF THE DRAWINGS

Referring to the drawings, wherein like numerals refer to like parts throughout the several views and this specification, aspects of presently disclosed principles are illustrated by way of example, and not by way of limitation.

DETAILED DESCRIPTION

Figure 1:
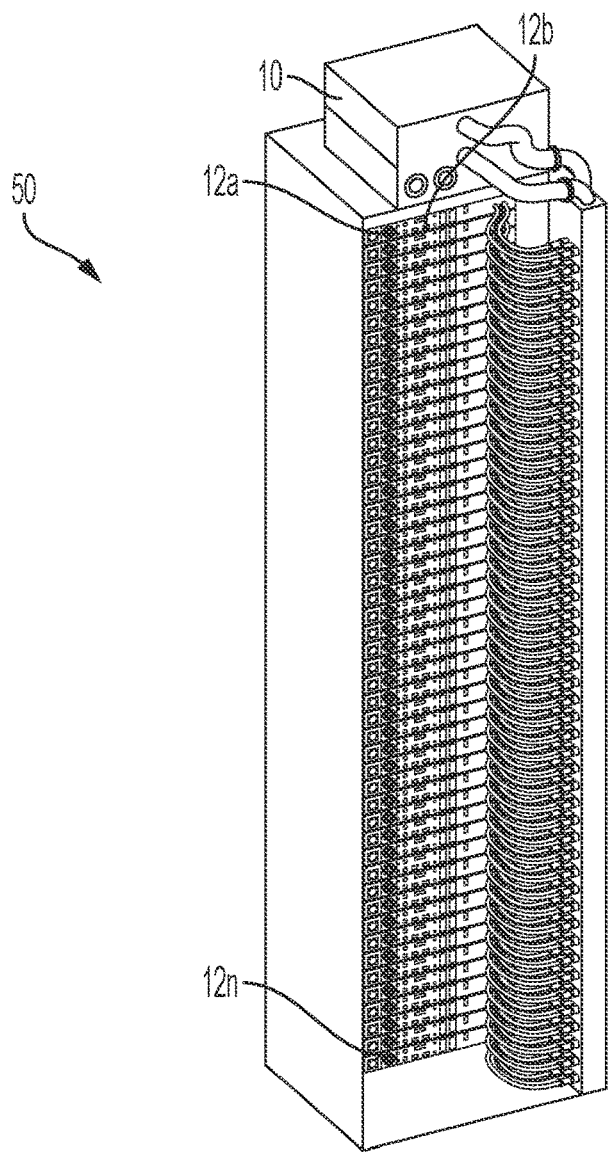
FIG. 1 illustrates a modular heat-transfer system configured to cool a plurality of independently operable, rack-mounted servers.

The following describes various principles related to smart components, systems and methods for transferring heat with liquid. For example, certain aspects of disclosed principles pertain to tailoring a cooling system's operation to an observed heat load or distribution of heat loads throughout the cooling system. That said, descriptions herein of specific apparatus configurations and combinations of method acts are but particular examples of contemplated components, systems, and methods chosen as being convenient illustrative examples of disclosed principles. One or more of the disclosed principles can be incorporated in various other embodiments to achieve any of a variety of corresponding characteristics.

Thus, embodiments having attributes that are different from those specific examples discussed herein can incorporate one or more presently disclosed principles, and can be used in applications not described herein in detail. Accordingly, such alternative embodiments also fall within the scope of this disclosure.

I. Overview

Component and overall heat dissipation during computationally intensive workloads may be much higher than component and overall heat dissipation during periods of low computation activity, as when a server is primarily transferring data rather than rendering graphics or performing other computationally intensive work. Such "I/O intensive" workloads can arise, for example, when a server serves data over a network connection for a streaming application.

And, although a typical server rack of the type used in a data center can accommodate 42 individual servers, some server racks can accommodate more or fewer individual servers. Further, some server racks might not be fully populated regardless of their capacity.

Thus, a cooling system designed to provide a static rate of cooling to each server (or component or rack) assumed to be present in a given installation, e.g., based on an anticipated upper threshold level of heat dissipation by each component in each server in each rack, may adequately cool the various components when all are operating under a heavy or maximum computational workload. However, that cooling system may provide unnecessary excess cooling to the various components under other workloads, e.g., that cause one or more servers (or components) to dissipate less heat. Stated differently, a cooling system designed for an upper threshold power dissipation by all servers in a given rack (or all servers in group of racks in a datacenter) may be over designed when the upper-threshold power dissipation only occasionally occurs on a per-server basis (and perhaps rarely if at all across all servers associated with the cooling system). That is to say, the cooling system may have excess cooling capacity, or margin, under "typical" datacenter workloads.

While a selected degree of margin or excess cooling capacity may be desirable, liquid cooling systems consume power to operate, e.g., to pump a coolant through the various cooling system components. Accordingly, providing "too much" excess cooling to a server (or a group of servers) can result in less-than-optimal overall efficiency for the aggregate installation. Accordingly, disclosed principles provide a means for tailoring the cooling capacity provided by a given cooling system to an actual amount of heat being dissipated by each component, server, and/or rack in a datacenter. Such tailoring of cooling capacity can improve overall efficiency for the server installation compared to a server installation that relies on a cooling system that provides "too much" excess cooling.

According to one aspect, tailoring the cooling capacity of a cooling system to a server installation can involve reducing the rate of cooling provided by a cooling system to match a server's (or a component's or a rack's) lower rate of heat dissipation during times of, for example, IO intensive operation. According to another aspect, tailoring the cooling capacity can involve matching the number of servers cooled by a given cooling system to that cooling system's overall cooling capacity. According to yet another aspect, tailoring the cooling capacity can involve adjusting one or more coolant temperatures, coolant flow rates, and/or other cooling-system parameters to adjust the rate of cooling provided by the cooling system to a selected one or more heat-dissipating components. Aspects of this disclosure pertain to systems, methods, and components for tailoring a liquid-cooling system's operation to an actual or estimated heat load that the liquid-cooling systems is called on to cool.

As but one illustrative example, a disclosed liquid-cooling system can tailor operation of one or more cooling nodes to the workload of a corresponding group of electronic components, group of servers incorporating or associated with such components, and/or group of racks incorporating or associated with such servers. For example, a liquid-cooling system can control a flow rate of coolant throughout the cooling system, through one or more selected branches of a coolant circuit, and/or through one or more selected cooling nodes of the cooling system. In some embodiments, a controller can adjust operation of one or more pumps, one or more valves, or a combination of one or more pumps and one or more valves to tailor the cooling capacity of a selected cooling nodes to correspond to the heat dissipated by the components, servers, and/or racks cooled by the cooling nodes.

Other, related principles also are disclosed. For example, the following describes machine-readable media containing instructions that, when executed, cause a processor of, e.g., a controller or other computing environment, to perform one or more disclosed methods. Such instructions can be embedded in software, firmware, or hardware. In addition, disclosed methods and techniques can be carried out in a variety of forms of processor or controller, as in software, firmware, or hardware.

II. Modular Heat-Transfer Systems

By way of example, FIG. 1 shows an array 50 of independently operable servers 12a, 12b . . . 12n mounted in a rack, or chassis, together with aspects of a modular heat-transfer system for cooling the servers. In FIG. 1, each server 12a-n contains one or more corresponding electronic components that dissipate heat while operating. A heat-transfer (e.g., cooling) system can use a liquid coolant to collect heat from each heat source and carry the heat to a suitable heat sink, e.g., a radiator that rejects the heat from the coolant to a facility liquid, atmospheric air, and/or air in a conditioned room containing the rack of servers. Such an arrangement for cooling rack mounted servers is described in further detail in U.S. Pat. No. 9,496,200.

FIG. 1 also shows a rack-level coolant-distribution unit 10. A coolant-distribution unit is sometimes referred to as a "coolant heat-exchange unit" when it incorporates a heat-exchanger to reject heat from the coolant passing through the coolant-distribution unit. In the embodiment depicted in in FIG. 1, the coolant-distribution unit 10 can have at least one pump and can also incorporate a reservoir and other components, regardless of whether the coolant-distribution unit incorporates a heat exchanger.

In the embodiment shown in FIG. 1, the coolant-distribution unit 10 incorporates a heat exchanger. When a heat exchanger is included within the confines of the coolant-distribution unit 10, as in FIG. 1, the coolant-distribution unit 10 can receive a warm coolant carrying heat from the servers 12a-n and facilitate transfer of that heat from the warm coolant to another medium. The coolant-distribution unit 10 can return the cooled coolant to the servers to collect further heat from the servers.

In other embodiments, a coolant-distribution unit receives cooled coolant from a heat exchanger outside the confines of the coolant-distribution unit or delivers warm coolant to a n external (e.g., outside the confines of the coolant-distribution unit) heat exchanger. The external heat exchanger cools the coolant before being distributed among and through the servers 12a-n.

Figure 2:
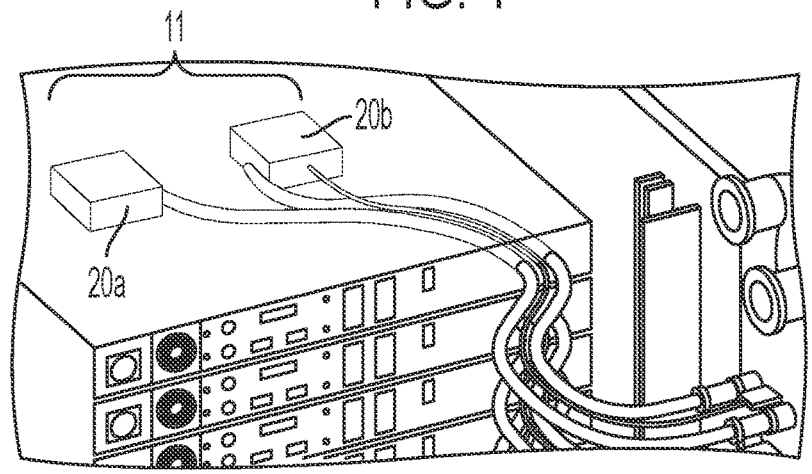
FIG. 2 shows an isometric view of a branch of the cooling system within a server shown in FIG. 1, together with two cooling nodes for cooling two corresponding electronic components in the server.

A modular cooling system as shown in FIGS. 1 and 2 can provide at least one cooling node for each server. As used herein, the term "node" means an identifiable component (or an identifiable group of components) within a system and the term "cooling node" means an identifiable component (or an identifiable group of components) that absorb(s) heat from an external source (e.g., that cools the external heat source).

For example, in context of a modular heat-transfer system for cooling one rack of 42 individual servers, the cooling system can have a cooling node for each server. Stated differently, the cooling system can have 42 server-cooling nodes, with each server-cooling node corresponding to one of the 42 servers in the rack. For example, the portion of the modular cooling system shown in FIGS. 1 and 2 provides a server-cooling node 11 for each server 12a-n.

Similarly, in context of a system for cooling a plurality of racks of servers (as described more fully below), a modular cooling system can provide a rack-cooling node for each rack of servers. In FIG. 1, for example, a rack-cooling node encompasses all 42 of the server-cooling nodes 11.

In similar fashion, a given server-cooling node (or more than one of them, or all of them) can incorporate one or more component-cooling nodes. For example, if a given server has two electronic components (e.g., two processors) to be cooled by that server's server-cooling node, that server's server-cooling node can provide one component-cooling node for each electronic component to be cooled. As FIG. 2 shows, the server cooling node 11 provides a first component-cooling node 20a and a second component-cooling node 20b. The first component-cooling node 20a is thermally coupled with a first processor to transfer heat from the first processor to a liquid coolant passing through the first component-cooling node 20a. Similarly, the second component-cooling node 20b is thermally coupled with a second processor to transfer heat from the second processor to a liquid coolant passing through the second component-cooling node 20b. Representative component-cooling nodes are described in further detail in U.S. Pat. Nos. 8,746,330 and 9,453,691. The component-cooling nodes can be passive, as in the '330 Patent, or they can be active, e.g., include a pump, as in the '691 patent.

FIG. 2 also depicts a portion of a coolant loop, or coolant circuit, that conveys coolant to and from the server-cooling node 11, as well as to and from each component-cooling node 20a, 20b. For example, the coolant-distribution unit 10 conveys cool coolant to a distribution manifold and receives warmed coolant from a collection manifold. The coolant loop shown in FIGS. 1 and 2 provides a branch of a fluid circuit for each server 12a-n. Each fluid-circuit branch receives cool coolant from the distribution manifold and conveys the cool coolant to the server-cooling node 11 where the coolant absorbs heat. Further, each fluid-circuit branch conveys warm coolant exiting from the server-cooling node 11 to the collection manifold, which returns the warmed coolant to the coolant-distribution unit 10. In the system shown in FIGS. 1 and 2, the fluid-circuit branch for each server-cooling node is fluidically coupled in parallel with the fluid-circuit branches for each of the other server-cooling nodes.

But, within the fluid-circuit branch shown in FIG. 2, the component-cooling nodes 20a, 20b are fluidically coupled with each other in series. For example, in FIG. 2, the component cooling node 20a receives cool coolant arriving from the coolant distribution manifold and heats the coolant with heat dissipated by the first processor. After exiting the first component-cooling node 20a, coolant heated by the first processor enters the second component-cooling node 20b, where the coolant is further heated by the second processor before returning to the coolant-distribution unit 10 by way of the collection manifold. Although not shown in FIG. 2, the component-cooling nodes 20a, 20b can be fluidically coupled with each other in parallel, which each component-cooling node receiving coolant from a corresponding further branch of the coolant circuit.

The cooling capacity of a given cooling node depends on many parameters. But, in a general sense, the available cooling capacity corresponds to a temperature of coolant entering the cooling node, a permissible increase in coolant temperature as it passes through the cooling node, and a flow rate of coolant passing through the cooling node. With all else being equal, a cooling node with a higher mass-flow rate of coolant passing through has a higher cooling capacity than it does with a lower mass-flow rate of coolant passing through. Accordingly, a cooling node that adequately cools a heat source (e.g., an electronic component, a server, or a rack of servers) that dissipates an upper threshold rate of heat will provide excess cooling to the heat source if the rate of heat dissipation by the source falls and the mass-flow rate of coolant through the cooling node remains unchanged.

Stated differently, as the rate of heat dissipated by a heat source falls, a mass-flow rate of coolant through the corresponding cooling node can be reduced. As a consequence of reducing the flow rate through the cooling node, the pressure (or head) loss due to friction through the portion of the coolant loop corresponding to the cooling node also is reduced. With such a reduction in head loss, the source of the pressure head (e.g., the pump) that drives the coolant through that cooling node may reduce its work on the coolant and thus may operate at a reduced power. For example, if a mass-flow rate of coolant through a portion of a coolant circuit can be reduced, less pressure head may be needed to urge coolant throughout the coolant loop and so it may be possible to reduce a pump speed, in turn reducing the amount of energy consumed by the cooling system. For a given rate of heat dissipated by a heat source, a reduction in mass-flow rate of coolant through the cooling node will lead to a correspondingly higher coolant-return temperature. For example, for a given rate of heat absorbed by a coolant that is assumed to be incompressible (e.g., water, a water-glycol mixture), the increase in coolant temperature across the region of heat transfer is linearly proportional to the flow rate of coolant through the region. In addition to saving energy expended by moving coolant through a cooling node, a relatively higher coolant-return temperature improves the quality of waste heat, increasing the ability to recover waste heat for useful purposes. By way of example, recovered waste heat can be used to heat domestic hot water, to heat a working fluid (e.g., water) in a hydronic heating system, and/or to perform useful work (e.g., in a power-generation or power-conversion device).

According to a disclosed aspect, a control system can receive real-time information that pertains to the rate of heat dissipated by a heat source, as well as real-time information that pertains to the cooling capacity provided by the cooling node that corresponds to the heat source. Responsive to the received real-time information, the control system can adjust, for example, the mass-flow rate of coolant through the cooling node to match the cooling capacity of the cooling node to the rate of heat dissipated by the heat source. Similarly, the control system can adjust the mass-flow rate of coolant through the cooling node to improve the quality of waste heat for useful purposes.

In an embodiment, the control system can reduce a pump speed or partially close a valve, or both, to reduce a flow rate of coolant through a given cooling node (as when the rate of heat dissipation by the heat source falls). Similarly, the control system can increase a pump speed or partially (or wholly) open a valve, or both, to increase a flow rate of coolant through the cooling node, as when the rate of heat dissipation by the heat source increases.

III. A "Smart" Modular Heat-Transfer System

Figure 3:
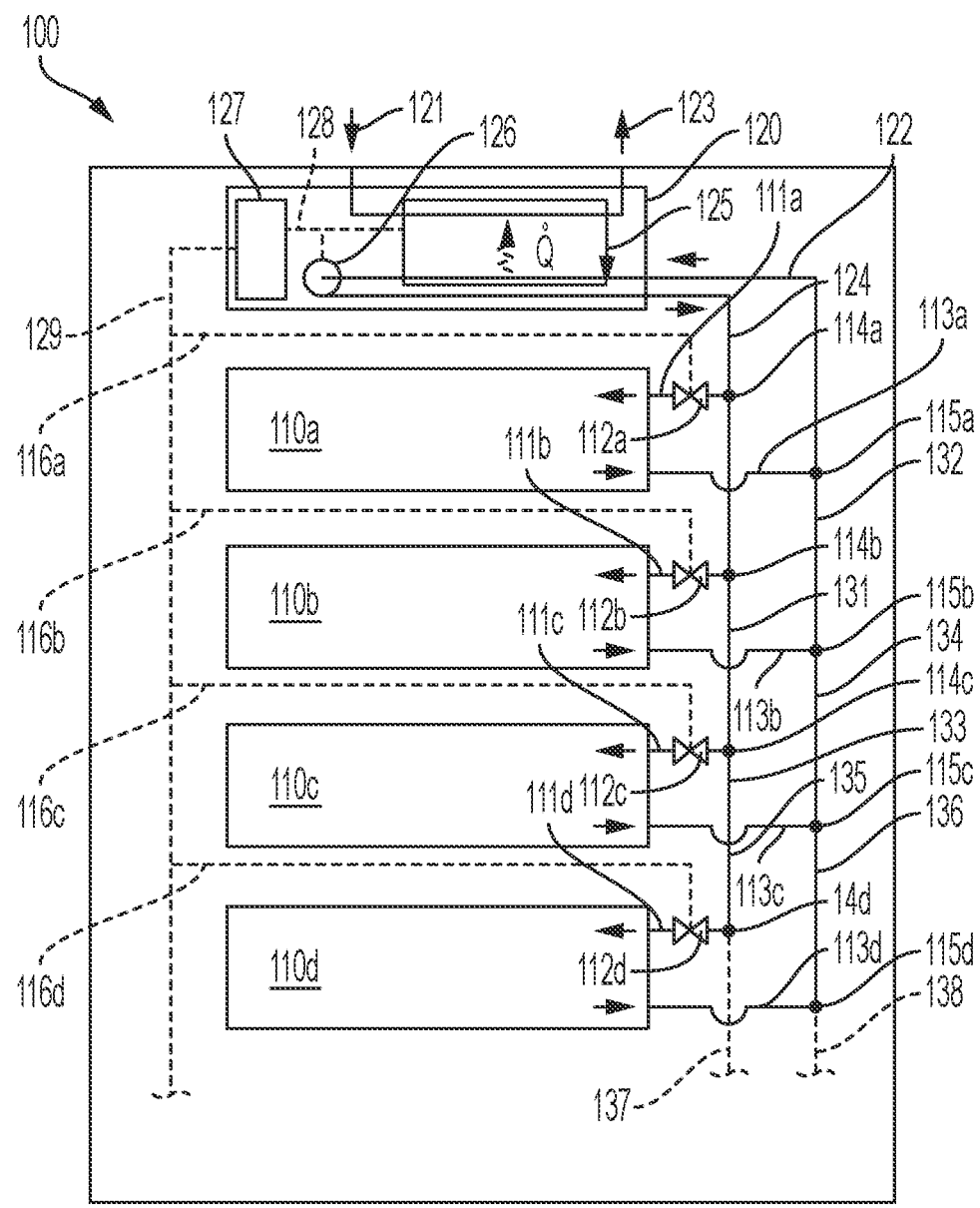
FIG. 3 schematically illustrates a portion of another embodiment of a modular heat-transfer system.

FIG. 3 schematically illustrates a portion of another embodiment of a modular heat-transfer system 100. The depiction in FIG. 3 shows four server-cooling nodes 110a, 110b, 110c, 110d, within a rack-level cooling loop, despite that the system 200 can have more or fewer server-cooling nodes within the rack-level cooling loop. For example, as with the modular heat-transfer system shown in FIG. 1, the heat-transfer system 100 can have 42 server-cooling nodes, with each server-cooling node corresponding to one rack-mounted server. Each server-cooling node 110a-d can have one or more component cooling nodes (e.g., analogous to the component-level cooling nodes 20a, 20b in FIG. 1).

The heat-transfer system 100 has a rack-mounted coolant-distribution unit 120. As depicted, the coolant-distribution unit 120 receives heated coolant from a collection manifold 122 and delivers cool coolant to a distribution manifold 124. The coolant-distribution unit 120 has within a liquid-to-liquid heat exchanger 125 that rejects heat, $\dot{Q}$, from the coolant received from the collection manifold 122 to cool facility coolant received by the facility supply inlet 121. As the facility coolant passes through the heat exchanger 125, it absorbs the heat, $\dot{Q}$, and increases in temperature, eventually exiting the heat exchanger through the facility return outlet 123. After rejecting the heat, $\dot{Q}$, the now cooled coolant enters a central circulation pump 126. An outlet from the pump is fluidically coupled with an inlet to the distribution manifold 124, allowing the cooled coolant to return to the several server-cooling nodes 110a-d.

Each server-cooling node 110a-d receives cool coolant from the distribution manifold 124 and returns heated coolant to the collection manifold 122. For example, each server-cooling node 110a-d has a supply connection 114a-d with the distribution manifold 124 and a return connection 115a-d with the collection manifold 122. In the illustrated embodiment of the heat-transfer system 100, a variable-position, controllable valve 112a-d is positioned intermediate the supply connection 114a-d with the distribution manifold and inlet 111a-d to the cooling node 110a-d. Stated differently, the branch of the coolant loop that conveys coolant to and from each server-cooling node 110a-d has a flow-control valve for adjusting a mass-flow rate of coolant that passes through each server-cooling node 110a-d.

The heat-transfer system 100 also has a controller 127, together with one or more communication connections (e.g., a signal bus) 128 that communicatively couples the controller 127 with one or more sensors as well as one or more flow-control devices. For example, based on information received from one or more sensors, the controller can output a control signal to adjust operation of one or more flow-control devices. As an example of such adjustments, an output signal from the controller can cause a valve to change or to maintain its opening within a range from 0% open (e.g., closed) to 100% open (e.g., unobstructed). As another example, the control output signal can cause a pump to speed up, slow down, start, or stop operation. For example, a coolant-distribution unit may have one or more pumps hydraulically coupled with each other in parallel, in series, or a combination of parallel and series to provide suited to maintain stable operation over a wide range of pressure-drop and flow-rate conditions. With such a coolant-distribution unit, the controller can adjust operation of one or more of the pumps to deliver a target pressure head and flow rate to the coolant loop of the cooling system 100.

Although the coolant-distribution unit 120 of the heat-transfer system 100 is depicted as incorporating a liquid-to-liquid heat exchanger 125, other embodiments of coolant-distribution units lack an internal heat exchanger, as discussed above in Section II. Further, the heat-transfer system 100 is depicted as having a central pump 126, but other embodiments of "smart" modular heat-transfer systems have no central pump and instead incorporate distributed pumps as described for example in U.S. Pat. No. 9,496,200. In such embodiments, the controller enjoys additional degrees of freedom to tailor cooling capacity through each cooling node. That is to say, the controller can adjust a speed or operating point of one or more pumps, e.g., a central pump and/or one or more distributed pumps (e.g., as a group or independently) to tailor the degree of cooling provided by each cooling node in the heat-transfer system.

IV. Another "Smart" Modular Heat-Transfer System

Figure 4:
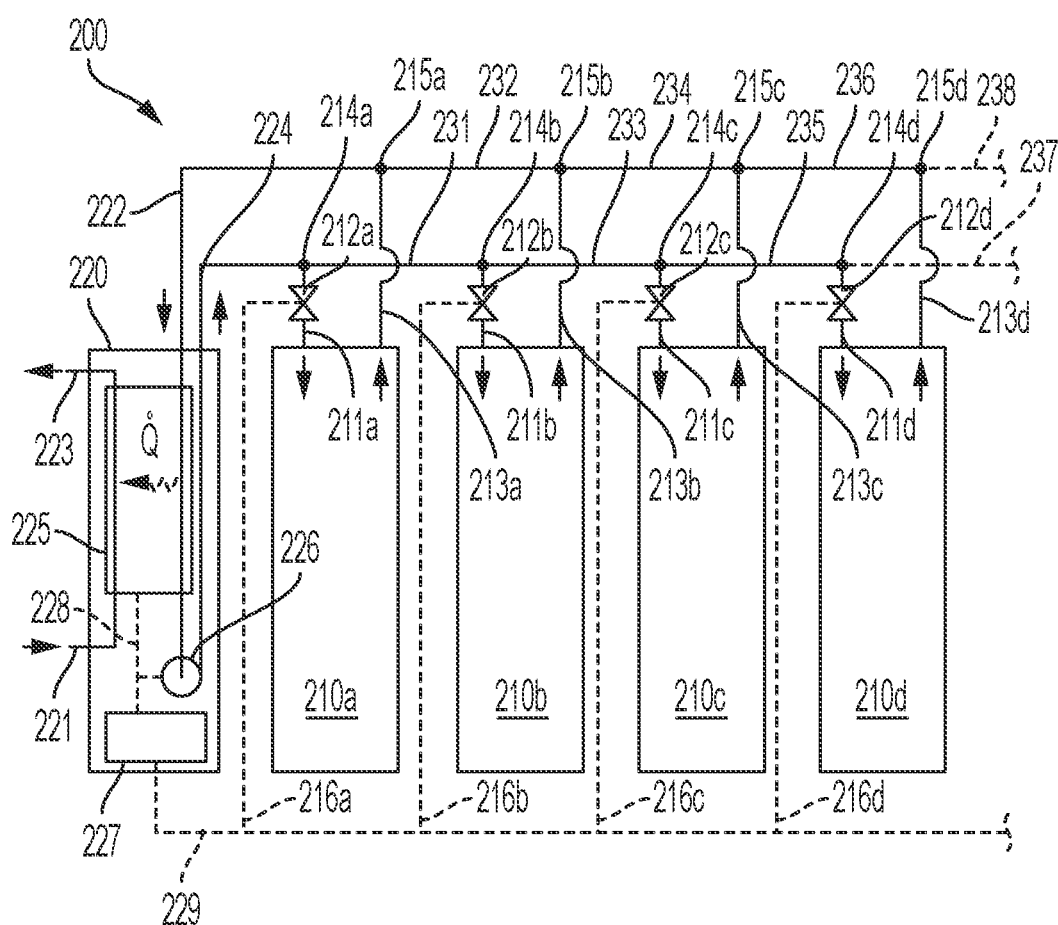
FIG. 4 schematically illustrates a portion of yet another embodiment of a modular heat-transfer system.

FIG. 4 schematically illustrates a portion of yet another embodiment of a modular heat-transfer system 200. The depiction in FIG. 4 shows four rack-cooling nodes 210a, 210b, 210c, 210d, within a datacenter-level cooling loop, despite that the system 200 can have more or fewer rack-cooling nodes within the datacenter-level cooling loop.

In FIG. 4, each server rack corresponding to a rack-level cooling node 210a, b, c, d contains an array of rack-mounted servers similar to the array of rack-mounted servers shown in FIGS. 1 and 3. However, unlike the heat-transfer system 100 shown in FIG. 3, which provides on-rack cooling to one array of rack-mounted servers, the heat-transfer system 200 shown in FIG. 4 provides cooling to several arrays of rack-mounted servers.

For example, as with the modular heat-transfer system shown in FIG. 1, each rack-level cooling node 210a-d can have 42 server-cooling nodes (e.g., analogous to server-cooling node 11), with each server-cooling node corresponding to one rack-mounted server. Further, each server-cooling node within each rack-level cooling node 210a-d can have one or more component cooling nodes (e.g., analogous to the component-level cooling nodes 20a, 20b in FIG. 1).

The heat-transfer system 200 includes an off-rack (e.g., stand-alone) coolant-distribution unit 220. As depicted, the coolant-distribution unit 220 receives heated coolant from a datacenter-level collection manifold 222 and delivers cool coolant to a datacenter-level distribution manifold 224. The coolant-distribution unit 220 has within a liquid-to-liquid heat exchanger 225 that rejects heat, $\dot{Q}$, from the coolant received from the collection manifold 222 to cool facility coolant received by the facility supply inlet 221. As the facility coolant passes through the heat exchanger 225, it absorbs the heat, $\dot{Q}$, and increases in temperature, eventually exiting the heat exchanger through the facility return outlet 223. After rejecting the heat, $\dot{Q}$, the now cooled coolant enters a central circulation pump 226. An outlet from the pump is fluidically coupled with an inlet to the distribution manifold 224, allowing the cooled coolant to return to the several rack-cooling nodes 210a-d.

Each rack-cooling node 210a-d receives cool coolant from the distribution manifold 224 and returns heated coolant to the collection manifold 222. For example, each rack-cooling node 210a-d has a supply connection 214a-d with the distribution manifold 224 and a return connection 215a-d with the collection manifold 222. In the illustrated embodiment of the heat-transfer system 200, a variable-position, controllable valve 212a-d is positioned intermediate the supply connection 214a-d with the distribution manifold and inlet 211a-d to the rack-cooling node 210a-d. Stated differently, the branch of the coolant loop that conveys coolant to and from each rack-cooling node 210a-d has a flow-control valve for adjusting a mass-flow rate of coolant that passes through each rack-cooling node 210a-d. In other embodiments, one or more of the controllable valves 212a-d can be positioned intermediate the return-manifold connection 213a-d. For example, all of the controllable valves can be positioned intermediate the return-manifold connection, or in other embodiments, one or more of the controllable valves can be positioned intermediate the supply connection 214a-d and one or more other of the controllable valves can be positioned intermediate the return-manifold connection.

As with the cooling system 100 shown in FIG. 3, one or more server-cooling nodes (not shown) within one or more of the rack-cooling nodes 210a-d can also have a flow-control valve for adjusting a mass-flow rate of coolant that passes through the server-cooling node(s) within the rack-cooling node. Alternatively (or additionally), one or more server-cooling nodes among the rack-cooling nodes 210a-d can have one or more pumps. Such server-level valves and pumps can allow a cooling-system operator to tailor the cooling capacity delivered to each server-cooling node.

Referring again to FIG. 4, the heat-transfer system 200 also has a controller 227, together with one or more communication connections (e.g., a signal bus) that communicatively couple the controller 227 with one or more sensors as well as one or more flow-control devices. For example, based on information received from one or more sensors, the controller 227 can output a control signal to adjust operation of one or more flow-control devices. As an example of such adjustments, an output signal from the controller can cause a valve to change or to maintain its opening within a range from 0% open (e.g., closed) to 100% open (e.g., unobstructed). As another example, the control output signal can cause a pump to speed up, slow down, start, or stop operation. For example, a coolant-distribution unit may have one or more pumps hydraulically coupled with each other in parallel, in series, or a combination of parallel and series to provide suited to maintain stable operation over a wide range of pressure-drop and flow-rate conditions. With such a coolant-distribution unit, the controller can adjust operation of one or more of the pumps to deliver a target pressure head and flow rate to the coolant loop of the cooling system 200.

Although the coolant-distribution unit 220 of the heat-transfer system 200 is depicted as incorporating a liquid-to-liquid heat exchanger 225, other embodiments of coolant-distribution units lack an internal heat exchanger. Further, the heat-transfer system 200 is depicted as having a central pump 226, but other embodiments of "smart" modular heat-transfer systems have no central pump and instead incorporate a plurality of pumps distributed among the rack-cooling nodes 210a-d and/or among the server-cooling nodes (not shown but analogous to the server-cooling nodes 110a-d) among the rack-cooling nodes 210a-d. In such embodiments, the controller enjoys additional degrees of freedom to tailor cooling capacity through each rack- and/or server-cooling node. That is to say, the controller can adjust a speed or operating point of one or more distributed pumps (e.g., as a group or independently) to tailor the degree of cooling provided by each cooling node in the heat-transfer system.

V. Sensors and Controllers for "Smart" Heat-Transfer Systems

As noted, the controller 127 (FIG. 3) and the controller 227 (FIG. 4) has a communication connection with one or more sensors (not shown) associated with its corresponding cooling system. Such sensors can determine, for example, one or more of an external air temperature, a dew point temperature, an external temperature of a facility supply inlet 121/221, a temperature of incoming facility coolant, a temperature of the facility coolant returned by the heat exchanger 125/225, a temperature of coolant entering the heat exchanger 125/225 from the collection manifold 122/222, a temperature of coolant leaving the heat exchanger 125/225 (e.g., entering the pump 126/226), a temperature of coolant exiting the coolant-distribution unit 120/220 and entering the coolant distribution manifold 124/224, a temperature of coolant entering each branch of the cooling loop (e.g., at the connections 114a-d/214a-d), a temperature of coolant entering each server-cooling node (e.g., at the inlets 111a-d/211a-d), a temperature of coolant entering, within, or exiting server-cooling node or a component-cooling node or a surface temperature of the component-cooling node (e.g., nodes 20a, 20b in FIG. 2), a case-temperature of an electronic component, a die-temperature of an electronic component, a temperature of a valve 112a-d/212a-d, a temperature of coolant exiting each server-cooling node 110a-d or rack-cooling node 210a-d, and a temperature of coolant entering the collection manifold 122/222 from each server-cooling node 110a-d (e.g., at the branch connections 115a-d) or from each rack-cooling node. Although temperature sensors are specified in the immediately preceding sentence, exemplary sensors associated with the modular cooling system 100/200 also include pressure sensors, which can measure static pressure, dynamic pressure, or a difference therebetween, at or around each of the foregoing positions, whether internal to the conduits of the cooling system (and thus indicating pressure within the coolant) or external to the conduits (and thus indicating pressure within the datacenter environment to which the cooling system 100/200 is exposed, e.g., a barometric pressure). Other representative sensors include, by way of example, leak-detection sensors located at one or more of the foregoing or other locations, flow-rate or fluid-speed sensors, humidity sensors, sensors for measuring a wet-bulb temperature or dew point, etc. Still other sensors can measure one or more physical parameters indicative of a coolant's "health," e.g., cooling capacity and/or remaining coolant life. Such sensors can include, by way of example, pH sensors for measuring coolant pH, hygrometers for measuring data-center humidity, hydrometers for measuring coolant density (or volume- or weight-fraction of water-to-additive (e.g., water-to-glycol)), refractometers for measuring coolant density (or volume- or weight-fraction of water-to-additive (e.g., water-to-glycol)), and other sensors suited for determining, for example, pH, reserve alkalinity, turbidity, electrical conductivity, volume- or weight-fraction of water-to-additive (e.g., water-to-glycol) and/or any other measure of "health" of the coolant within the cooling system 100/200.

Further exemplary sensors include sensors configured to determine an operating speed of the pump 126/226, power being delivered to a component, a server and/or a rack of servers, IT workload, and even a configuration or type of component, server, or rack of servers. In some embodiments, sensors can be hardware sensors or sensors can be embodied in software or firmware (e.g., a software or firmware sensor can output information relating to IT workload on or among a group of components, servers or racks, and the controller 127/227 can receive such information over a communication connection (e.g., communication connection 128/228 or 129/229).

In still another embodiment, the controller can receive configuration information (as may be stored in read-only memory or other memory) pertaining to one or more thermal characteristics or cooling requirements for a component, a server, or a rack within a given datacenter installation. For example, a such a memory may store information relating to component or server power dissipation under different IT workloads. As another example, such a memory may store information relating to cooling system parameters, such as which model of pump is installed in a given coolant-distribution unit, or even what size of impeller is provided in a pump. Such information pertaining to pumps can be used by the controller to identify pump performance curves (e.g., to assess or to determine available pressure head for across a range of output flow-rate) for various pump speeds and/or impeller sizes.

Similarly, read-only memory can provide the controller with information pertaining to the number of rack-cooling nodes, server-cooling nodes within each rack, and component-cooling nodes within each server. The controller can use such information, combined with information pertaining to the plumbing configuration for each branch of the coolant loop, to determine or to estimate how pressure varies throughout the coolant loop under various pump-outlet flow rates. With knowledge of a pump curve and system pressure curve, output flow-rate from a coolant-distribution unit 120/220 can be estimated for a given coolant loop.

Moreover, a network-flow-modeling analysis can inform the controller as to coolant flow-rate through each branch of the coolant loop for a given output flow-rate from the coolant-distribution unit 120/220. For example, based on a mass-balance, the mass-flow rate through a segment 131/231 of a coolant loop equals the mass-flow rate through the segment 124/224 less the mass-flow rate through the valve 112a/212a. Mass-flow rate through the segments 133/233, 135/235, 137/237 can be similarly determined. Further, mass flow-rate through the segment 132/232 equals the mass-flow rate entering the coolant distribution unit 120/220 from the collection manifold 122/222 less the mass-flow rate returning to the collection manifold through the segment 113a/213a. Mass-flow rate through the segments 234, 236, and 238 can be similarly determined based in part on the mass-flow rates returning from the rack-cooling nodes through the segments 113b-d/213b-d.

And still further, the controller can estimate a cooling capacity of each cooling node based in part on an estimated coolant flow rate through each cooling node. If the cooling capacity for any cooling node exceeds a cooling demand estimated from sensor inputs and configuration information, the controller can output a control signal to adjust one or more valves (e.g., to increase or to decrease a degree of valve openness or closed-ness) and/or to adjust a pump speed.

VI. Waste-Heat Recovery Systems

Figure 5:
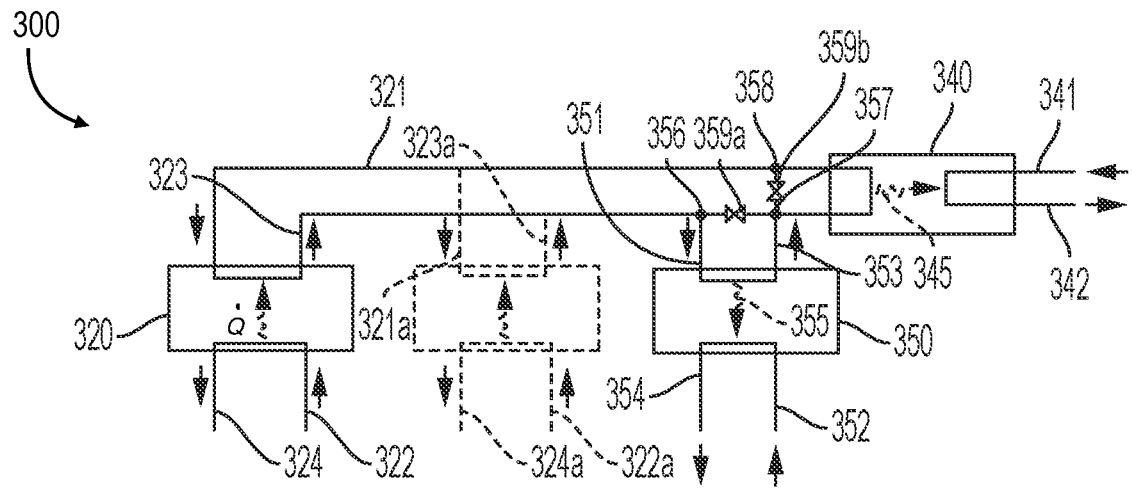
FIG. 5 schematically illustrates a further embodiment of a modular heat-transfer system incorporating a waste-heat recovery branch. The heat-transfer system in FIG. 5 can be analogous to the system shown in any of FIGS. 1, 3 and 4 with an added waste-heat recovery branch.

FIG. 5 schematically illustrates an installation of one or more heat transfer systems as described above in connection with FIGS. 1 through 4. As with systems described above, the installed heat-transfer system 300 provides cool facility coolant to a coolant distribution unit 320. The coolant distribution unit 320 is analogous to the coolant distribution units 120, 220 described above.

For example, the coolant distribution unit 320 facilitates cooling of a server-cooling loop, receiving coolant heated by one or more heat-dissipation nodes, rejecting heat $\dot{Q}$ to a facility coolant and returning the cooled coolant to the one or more heat-dissipation nodes, e.g., server nodes as in FIG. 3 or rack nodes as in FIG. 4. The installed heat-transfer system 300 conveys the now-heated facility coolant to a facility-level cooler 340, which facilitates rejecting heat 345 from the facility coolant to an ultimate heat-sink 341, 342 (e.g., the atmosphere, the Earth, a body of water, Space, etc.), cooling the facility coolant. The installed heat-transfer system 300 subsequently conveys the now-cooled facility coolant back to the coolant distribution unit 320 to provide further cooling to the server-cooling loop.

More particularly, in the illustrated embodiment, the coolant-distribution unit 320 receives heated server/rack coolant from a collection manifold 322 and delivers cool server/rack coolant to a distribution manifold 324 after rejecting heat from the server/rack coolant to the facility coolant. The coolant-distribution unit 320 has within, in this embodiment, a liquid-to-liquid heat exchanger (not shown) that rejects heat, $\dot{Q}$, from the server/rack coolant received from the collection manifold 322 to the relatively cooler facility coolant received from the facility supply inlet 321. As the facility coolant passes through the heat exchanger, it absorbs the heat, $\dot{Q}$, and increases in temperature, eventually exiting the heat exchanger through the facility return conduit 323. After rejecting the heat, $\dot{Q}$, the now cooled server/rack coolant returns to the several nodes to be cooled, e.g., rack-nodes or server-nodes (or both).

In addition to providing cool facility coolant to the coolant-distribution unit 320, the system 300 can recover some waste heat carried by the facility return conduit 323. For example, the system 300 can include a waste-heat-recovery branch 351 fluidly coupled with the return conduit 323, e.g., with a fluid coupler 356. With such a branch 351, a portion (e.g., a fractional portion or a whole portion) of the heated facility coolant can be directed from the return conduit 323 into the waste-heat-recovery branch 351. The waste-heat-recovery branch 351 can convey the warm facility coolant to a waste-heat-recovery device 350. A valve 359a can be used to cause some or all of the facility coolant to be directed through the waste-heat-recovery branch 351. For example, when the valve 359a is partially closed, a portion (e.g., a minor fractional portion, a major fractional portion, or a whole portion) of the facility coolant can pass through the valve 359a while a balance of the flow of facility coolant will tend to pass into the branch 351.

A waste-heat-recovery device 350, in turn, can include a heat-exchanger (e.g., a liquid-to-liquid heat exchanger, a liquid-to-air heat exchanger, etc.) configured to facilitate heat transfer 355 from the heated facility coolant received from the waste-heat-recovery branch 351 to another, cooler working fluid. For example, the waste-heat-recovery device 350 can receive a flow of cool working fluid through an inlet conduit 352 and can provide a thermal coupling between the flow of warm facility coolant and the relatively cooler working fluid, allowing the working fluid to absorb the transferred heat 355. The waste-heat-recovery device 350 can convey the then-heated working fluid through an outlet conduit 354 for other heating purposes (e.g., floor heating, industrial heating, room heating, etc.)

In some embodiments, the working fluid can be room air from an office space and the waste-heat-recovery device 350 can be used to provide or to supplement heating of the room air. In other embodiments, the working fluid is a liquid, e.g., water or a mixture containing water. A liquid heated by the waste-heat-recovery device 350 can be used in a radiant heating system to supplement room heating in some embodiments or to supply heat to an industrial process in other embodiments.

After rejecting the heat 355 from the facility coolant, the waste-heat-recovery device 350 can return the now-cooled facility coolant to the main facility loop through the return line 353. In the embodiment in FIG. 5, a coupler 357 joins the return line 353 with the facility return conduit 323. As well, a shunt conduit extends from the return conduit 323 to the supply conduit 321, e.g., a coupler 358 couples the shunt conduit with the supply conduit 321.

A valve 359b can control whether facility coolant passes through the shunt conduit. For example, when a temperature of the facility coolant in the return line 353 is at or below a threshold temperature for the inlet to the facility-level cooler 340, the valve 359b can permit the relatively cool facility coolant from the return line 353 to directly flow into the supply conduit 321. Alternatively, another portion (e.g., a minor fractional portion, a major fractional portion, or a whole portion) of the facility coolant returning from the waste-heat-recovery device 350 can be allowed to pass into the supply conduit 321 with the balance of the facility coolant returning from the waste-heat-recovery device 350 being allowed to pass to an inlet to the facility-level cooler 340. For example, when the valve 359b is partially closed, a portion (e.g., a minor fractional portion, a major fractional portion, or a whole portion) of the facility coolant can pass from the return line 353 through the valve 359b, while a balance of the flow of facility coolant from the return line will tend to pass into the facility return line 323 and ultimately into the facility-level cooler 340.

Although FIG. 5 shows only valves 359a and 359b, the system 300 can include one or more additional valves. For instance, an optional control valve (not shown) can be positioned within a branch of the facility-level loop having the facility-level cooler 340, e.g., in the return line 323 between the coupler 357 and an inlet to the facility-level cooler 340, in the supply line 321 between the facility-level cooler 340 and the coupler 358, or within a conduit of the facility-level cooler 340. The optional control valve can be closed when the valve 359b is opened. Such an arrangement will ensure that facility coolant passes through the shunt conduit (e.g., through the valve 359b) from the return line 323 to the supply line 321.

Whether cooled by one or both of the facility-level cooler 340 and the waste-heat-recovery device 350, the system 300 supplies cool facility coolant to the coolant distribution unit 320 through the supply line 321.

Further, operation of the valve 359b with the optional control valve can be coordinated to selectively control the portion (e.g., a minor fractional portion, a major fractional portion, or a whole portion) of the facility coolant that passes through the shunt conduit from the return line 323 to the supply line 321 compared to the portion (e.g., a minor fractional portion, a major fractional portion, or a whole portion) of the facility coolant that passes through the facility-level cooler 340 from the return line 323 to the supply line 321. For example, as described more fully below, a controller can selectively adjust the valve 359b and selectively adjust the optional control valve. As a more particular, but non-exclusive example, the controller can adjust each of the valve 359b and the optional control valve to a desired opening within a range of opening arrangements extending from a fully closed arrangement to a fully open arrangement to achieve a desired apportionment of flow rate of the facility-level coolant through the shunt conduit and through the facility-level cooler 340.

As just one example, a controller can incorporate a processing unit. The processing unit can implement a known flow-network modelling technique using stored or retrievable head-loss information associated with the system 300 to select an opening position for each of the valve 359b and the optional control valve that suitably apportions the flow of facility coolant through the shunt conduit and the facility-level cooler. For example, a data store or other accessible memory can store head-loss information associated with valve 359b, the optional control valve and other portions of the system 300 (e.g., shunt-conduit, the branch of the system 300 that includes the facility-level cooler 340 and the remainder of the fluid-distribution loop in the system 300). The processing unit can incorporate and combine such head-loss information with known or modeled pump curves to assess and determine flow rates through one or more (or all) of the conduits of the system 300. As well, the controller can acquire sensor data and/or predict temperatures and pressures at one or more locations throughout the system 300. Responsive to a flow-rate, a pressure at a given location or a pressure-drop through a segment of the system 300, a temperature at a given location or a change in temperature through a segment of the system, or another observed or computed condition of the system 300, the controller can adjust operation of one or more flow-control devices within or among the system 300 (e.g., the valve 359b, the optional control valve, or the valve 359a, another system valve, a pump). Such adjustments can be made while commissioning a new system, starting up a newly-installed system, or during real-time operation of the system 300.

FIG. 5 also shows an optional second coolant distribution unit in dashed lines. As with the coolant-distribution unit 320, the coolant-distribution unit in dashed lines can receive cool facility coolant from the facility supply 321, e.g., through supply branch 321a, which can facilitate cooling of a second secondary cooling loop by absorbing heat in a manner as described in connection with the coolant-distribution unit 320. Similarly, the coolant-distribution unit in dashed lines can return heated facility coolant to the facility return 323, e.g., through the return branch 323a. In addition, though not illustrated in FIG. 5, one or more further coolant-distribution units analogous to the coolant-distribution unit 320 can be coupled with the facility supply 321 and the facility return 323 in a manner analogous to that shown and described in reference to the coolant-distribution unit in dashed lines. A flow rate of facility coolant through the facility supply 321 and facility return 323, as well as a cooling capacity provided by one or more waste-heat-recovery devices analogous to the waste-heat-recovery device 350 and the facility-level cooler 340, can be selected according to an anticipated demand for cooling imposed by a selected number and sizes of coolant-distribution units 340 to be cooled by the facility system 300.

The embodiment of the system 300 discussed above recovers waste-heat from a facility coolant. That being said, principles and aspects of heat-transfer systems described above in detail in connection with the system 300 can be applied analogously to other heat transfer systems described above in detail. Accordingly, a waste-heat recovery device can be configured to recover waste-heat from coolant circulating through any of the modular heat-transfer systems described above (e.g., from coolant circulating through a coolant-distribution unit and one or more corresponding component-cooling nodes).

VII. Control Logic, Pump Curves and System Operating Curves

As noted above, pressure loss through a given coolant loop or branch thereof as a function of mass-flow rate of coolant through the loop or branch can be adjusted by a controller 127/227. FIG. 5 schematically illustrates, for a given pump operating at a constant speed, how the system operating point (and resulting pump-efficiency) can change by adjusting, for example, one or more flow-control valves that impart a higher- or a lower-pressure loss through the coolant loop (or branch).

FIG. 5 shows a plot 300 of pressure head (or loss) as a function of flow rate for a pump and for a given coolant loop. The curve 310 depicts a nominal curve of pressure-loss through a coolant loop as a function of flow-rate through the coolant loop. As the curve 310 shows, pressure loss through the coolant loop (or branch thereof) increases (or decreases)

roughly with the square of flow rate. The operating point (flow rate and pressure drop) 320 for the coolant loop (or branch) is found by the intersection of the system curve 310 with the pump curve 330. The pump curve 330 depicts how pressure head provided by the pump varies as a function of discharge flow rate provided by the pump. Overlaid on the plot 300 are estimates of different pump efficiencies (e.g., available fluid energy discharged by the pump divided by the power consumed by the pump at different operating points along the pump curve 330. For the pump whose operating curve 330 is depicted in FIG. 5, the point of most efficient operation lies between the tick-marks labeled $\eta_1$.

As the operating point moves to higher discharge heads and lower flow rates from the upper tick-mark labeled $\eta_1$ or to lower discharge heads and higher discharge flow rates, pump efficiency drops, as indicated by the tick-marks labeled $\eta_2$ and $\eta_3$. Accordingly, by partially closing a flow-control valve or removing a server-cooling node, overall pressure loss increases across various flow rates through the coolant loop, as shown by the adjusted system curve 314. Perhaps counter-intuitively, for this particular pump and system adjustment, overall pumping efficiency can increase, as indicated by movement from a region of relatively lower efficiency (the lower tick-mark labeled $\eta_2$) to a region of relatively higher efficiency (toward the tick-mark labeled $\eta_1$).

By contrast, by partially opening a flow-control valve or perhaps by adding a server-cooling node to a branch of the coolant loop, overall pressure loss can decrease across various flow rates through the coolant loop, as shown by the adjusted system curve 312. Again, perhaps counterintuitively, for this particular pump and system adjustment, overall pumping efficiency can decrease, as indicated by moving from a region of relatively higher pump efficiency to a region of relatively lower pump efficiency.

Figure 6:
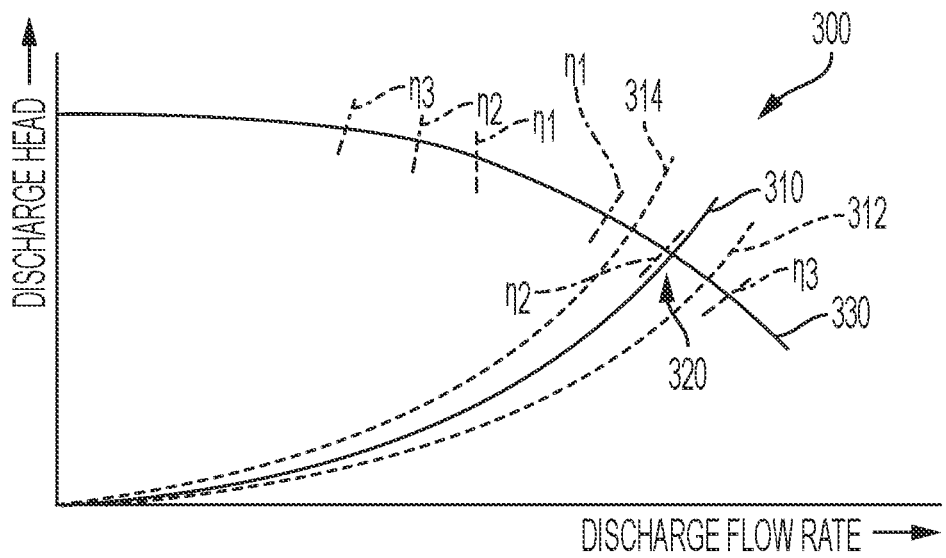
FIG. 6 shows a plot of pressure head (or loss) as a function of flow rate for a pump and for a given coolant loop under different operating conditions.

The foregoing discussion of operating point was based on a pump operating at a constant speed. However, as noted above, a controller 127/227 can control the speed of one or more pumps, adding to the degrees-of-freedom available to the controller to tailor flow-rate (and thus cooling capacity) among rack-, server-, and component-cooling nodes to achieve efficient overall operation. For example, FIG. 6 shows a family 400 of pump curves 402, 404, 406 and 408, each of which corresponds to a given pump speed different from the speed corresponding to the pump curve 330. Overlaid on the family 400 of pump curves are lines of constant pump efficiency ($\eta_1$, $\eta_2$, and $\eta_3$), as well as lines indicating pumping power ($P_1$, $P_2$, and $P_3$). Combining the family 400 of pump curves shown in FIG. 6 with the system curve 310 and its variants 312, 314 arising from adjusting flow-control valves (e.g., valves 111a-d/211a-d) can yield the operating point for the cooling systems 100, 200.

As briefly explained above, these various pump curves and system curves can be stored in a retrievable memory (e.g., memory 92, storage 94, or storage 98b in FIG. 6). A controller (e.g., controller 127, 227 in FIGS. 3 and 4) can retrieve these pump curves and system curves to select a suitable pump speed and valve position among the flow-control valve based, for example, on a measure of IT workload to be cooled by each component-, server-, and/or rack-cooling node within the cooling system 100, 200.

For example, a given heat-transfer system installation can be calibrated as by determining an overall system curve for each in a plurality of setting combinations of the flow-control valves 112a-d, 212a-d. These calibrations can be stored in a memory and retrieved by the controller when it is called to assess and if appropriate to adjust one or more flow-control valve settings based on a given distribution of IT workload among the servers and components cooled by the heat-transfer system. Similarly, a family of pump curves (and the annotated power curves and efficiency curves as in FIG. 6) can be stored in a memory and retrieved by the controller. The controller (or an associated processor) can select a suitable combination of flow-control-valve settings and pump speeds to achieve a system operating point that provides an adequate degree of cooling to each rack-, server-, and/or component-cooling node of interest based on the observed distribution of IT workload.

Although a closed-form solution to such an optimization problem would rarely if ever be available, computational approaches suitable for such optimizations are well-known under the general category of machine learning. As but several exemplary approaches, a Bayesian search, a gradient descent method, a genetic algorithm and a spectral method can be used to identify a suitable combination of valve settings and pump speeds to provide a distribution of cooling among various rack-, server-, and component-cooling nodes tailored to a distribution of IT workload to be cooled.

In still a further embodiment, the distribution of IT workload can itself be adjustable to obtain efficient overall operation (e.g., based on a combination of power consumed by the IT workload and power consumed by the cooling system). For example, adjusting the distribution of IT workload (which here is being used as a proxy for the distribution of dissipated heat among the various components, servers and racks in a data center) can facilitate tailoring the distribution of cooling among various rack-, server-, and component-cooling nodes to the IT workload. For instance, if a given cooling node of a liquid-based cooling system receives a relatively high mass-flow rate of coolant (and thus has available a relatively high cooling capacity) across a variety of flow-control valve and pump settings, a data center installation that can selectively adjust the distribution of its IT workload stands to benefit from concentrating relatively heavier IT workloads among the components, servers, and/or racks cooled by that higher-capacity cooling node and distributing relatively lower IT workloads elsewhere to be cooled by the relatively lower-capacity cooling nodes.

VIII. Telemetry, Anomaly Detection, and a System Control Gateway

Telemetry data from various sensors and flow devices described above can be tied into the Data Center Information Manager (DCIM) software and Building Management System (BMS) software to monitor the system performance, as a whole. For example, a system control gateway can provide a communication interface between control logic for a coolant-distribution unit (CDU) (e.g., the controller 127 in FIG. 3 or the controller 227 in FIG. 4) and a pre-existing DCIM/BMS.

In an embodiment, the gateway has a first communication connection with the control logic for the liquid-cooling system and a second communication connection with the DCIM/BMS system. Notably, a communication protocol over the first communication connection with the liquid-cooling system's control logic can differ from a communication protocol over the second communication connection with the DCIM/BMS system. Further, the physical (or wireless) interfaces over which the communication connections exist can differ between the first communication connection and the second communication connection. For example, the first communication connection (e.g., to the liquid-cooling system's control logic 127) can incorporate Cat6 Ethernet connections for SNMP, Modbus IP, RS-485, CANBus and other known communication protocols. And, the first communication connection can include one or more discrete I/O and analog input connections suitable for various types of sensors, including for example, leak-detection sensors. An advantage of digitized communication of sensor signals using such protocols, for example, is that the sensors need not be positioned close to the gateway device. Further, digitized sensor signals can be less susceptible to electromagnetic interference and other sources of noise that can interfere with a sensor signal, providing a more reliable signal over longer distances than analog sensor signals can provide.

By contrast, DCIM and BMS systems commonly interface with a network over an ethernet connection using other communication protocols, such as, for example, BACNet, SNMP, Modbus and Redfish. Nonetheless, the gateway can serve as a middle-ware layer that translates information pertaining to the liquid-cooling system into information that the DCIM and BMS system can absorb. For example, the secondary supply temperature in one embodiment can be read from address 30015 as a 16-bit signed integer with a scale of 0.1. In another embodiment, he secondary supply temperature can be read from address 30012 as a 32-bit signed integer with a scale factor of 0.1. In this example, the gateway can incorporate a look-up table or other data store that relates each in a plurality of cooling systems with a corresponding address, data length, and scale factor for the secondary supply temperature. Of course, a given liquid-cooling system can incorporate any number of sensors of various types, as described above. Accordingly, the data store can relate each liquid-cooling system (or component) with a selected plurality of sensors and sensor types. Further, the data store can relate each sensor or sensor type with an address, word length, scale factor and any other selected parameter suitable to obtain relevant information.

Additionally, the gateway can map each sensor or sensor type to a given variable or register in a DCIM or BMS data structure. Accordingly, when the gateway receives information from the liquid cooling system or its control logic, the gateway can map the received data to a suitable channel in the DCIM or BMS system, allowing the DCIM or BMS system to receive data from the liquid-cooling system. With such a standardized gateway, the amount of software required to interface to a new device can be significantly reduced.

Further, such a gateway can provide enhanced anomaly detection across a plurality of installed heat-transfer systems. For example, control logic for a given modular heat-transfer system, as described above, may receive information from a selected array of sensors and/or servers. Nonetheless, a given data-center installation may include a plurality of such modular heat-transfer systems, e.g., dozens, hundreds, or thousands of such systems. Accordingly, a gateway can access information from each modular heat-transfer system and not just from the servers or sensors associated with a single cooling loop. Accordingly, the gateway can implement a multi-variate anomaly-detection technique to assess whether operating anomalies (e.g., leaks, over-temperature components, failed or failing pumps, etc.) have occurred or are likely to occur within any one or more in the plurality of heat-transfer systems.

Similarly, the gateway can predict when maintenance or repairs should occur, rather than relying solely on pre-defined maintenance intervals or waiting for an outright failure to occur. For example, a gateway can monitor flow rate as a function of pump speed evaluate how that relationship might evolve over time. In this example, if flow-rate decreases over time at a given pump speed, then a pump may need to be serviced or a filter may need to be changed (e.g., a decrease in flow-rate can indicate a failed or failing pump or increased pressure-head in the system due to filter blockages).

Further, a gateway can receive an interrupt or other signal directly from a leak-detection sensor or via a controller (e.g., control logic 127, 227), providing a facility with a pathway for responding to a leak, in addition to the response provided by a given cooling node or cooling loop. For example, a DCIM or a BMS might adjust or re-route a supply of coolant to the branch in which a leak is detected, in addition to, for example, a cooling loop's controller disconnecting or otherwise isolating coolant from or within the branch. As another example, input to a DCIM or a BMS can permit the DCIM or BMS to adjust a server workload or to transfer the server workload from a server affected or in the vicinity of a leak to another server remotely positioned from the leak and out of harm's way from the leak. In such an operation, the DCIM or BMS can supplement or otherwise route coolant to the remotely positioned server.

As yet another advantage provided by a gateway that aggregates information across closed-loop or modular heat-transfer system, overall energy consumed by cooling an installation can be monitored, controlled or reduced. For example, a data-center installation can have a plurality of closed-loop or modular heat-transfer systems. Within each closed-loop system, control logic can determine a minimum flow rate that each rack (or node) needs to maintain a given component (e.g., a processor) at or below a threshold temperature, as described above.

A gateway that monitors a plurality of closed-loop heat-transfer systems, in turn, can aggregate control over the plurality of closed-loop systems and inform whether pumps in a given closed-loop system need to be operated at a higher flow rate (and thus consume more power) or whether they can operate a lower flow rate (and thus consume less power). For example, a gateway in communication with a DCIM/BMS system (e.g., over an IPMI bus) can receive information relating to a current or an anticipated workload on one or more servers. The gateway can respond to a current or anticipated workload for a group of servers in a given closed-loop system by tailoring flow rates within those servers to the workload.

Similarly, the gateway can assess a measure of cooling margin remaining in a given closed-loop system and communicate that assessment to a DCIM/BMS controller, which can in turn tailor a workload on the servers cooled by that system to correspond to the remaining margin. For example, one or more servers cooled by a given closed-loop heat-transfer system might have excess cooling applied to them under a given workload. The gateway can observe the operating conditions of those one or more servers, determine that the servers are available for increased workload, and communicate that availability to the DCIM/BMS system. In response, the DCIM/BMS system can schedule future workloads to be applied to the under-utilized servers, balancing workloads across the servers in a given installation while ensuring that power consumed by the cooling system is kept low or is minimized. Further, a smart manifold as described above can be used to tailor cooling across a plurality of nodes to similarly maintain lower power usage while providing adequate server cooling.

IX. Computing Environments

Figure 7:
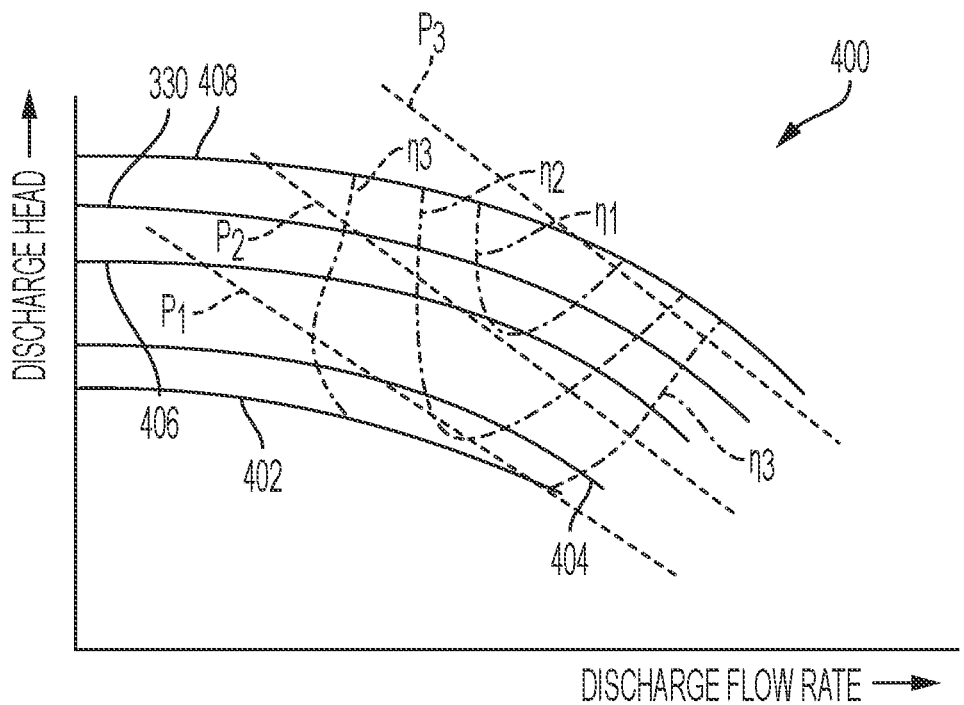
FIG. 7 shows a family of pump curves for a pump operating at several different speeds.

FIG. 7 illustrates a generalized example of a suitable computing environment 90 in which described methods, embodiments, techniques, and technologies relating, for example, to maintaining a temperature of a logic component and/or a power unit below a threshold temperature can be implemented. The computing environment 90 is not intended to suggest any limitation as to scope of use or functionality of the technologies disclosed herein, as each technology may be implemented in diverse general-purpose or special-purpose computing environments. For example, each disclosed technology may be implemented with other computer system configurations, including wearable and/or handheld devices (e.g., a mobile-communications device), multiprocessor systems, microprocessor-based or programmable consumer electronics, embedded platforms, network computers, minicomputers, mainframe computers, smartphones, tablet computers, data centers, servers and server appliances, and the like. Each disclosed technology may also be practiced in distributed computing environments where tasks are performed by remote processing devices that are linked through a communications connection or network. In a distributed computing environment, program modules may be located in both local and remote memory storage devices.

The computing environment 90 includes at least one central processing unit 91 and a memory 92. In FIG. 7, this most basic configuration 93 is included within a dashed line. The central processing unit 91 executes computer-executable instructions and may be a real or a virtual processor. In a multi-processing system, or in a multi-core central processing unit, multiple processing units execute computer-executable instructions (e.g., threads) to increase processing speed and as such, multiple processors can run simultaneously, despite the processing unit 91 being represented by a single functional block. A processing unit can include an application specific integrated circuit (ASIC), a general purpose microprocessor, a field-programmable gate array (FPGA), a digital signal controller, or a set of hardware logic structures arranged to process instructions.

The memory 92 may be volatile memory (e.g., registers, cache, RAM), non-volatile memory (e.g., ROM, EEPROM, flash memory, etc.), or some combination of the two. The memory 92 stores software 98a that can, for example, implement one or more of the technologies described herein, when executed by a processor.

A computing environment may have additional features. For example, the computing environment 90 includes storage 94, one or more input devices 95, one or more output devices 96, and one or more communication connections 97. An interconnection mechanism (not shown) such as a bus, a controller, or a network, interconnects the components of the computing environment 90. Typically, operating system software (not shown) provides an operating environment for other software executing in the computing environment 90, and coordinates activities of the components of the computing environment 90.

The store 94 may be removable or non-removable, and can include selected forms of machine-readable media. In general machine-readable media includes magnetic disks, magnetic tapes or cassettes, non-volatile solid-state memory, CD-ROMs, CD-RWs, DVDs, magnetic tape, optical data storage devices, and carrier waves, or any other machine-readable medium which can be used to store information and which can be accessed within the computing environment 90. The storage 94 can store instructions for the software 98b, which can implement technologies described herein.

The store 94 can also be distributed over a network so that software instructions are stored and executed in a distributed fashion. In other embodiments, some of these operations might be performed by specific hardware components that contain hardwired logic. Those operations might alternatively be performed by any combination of programmed data processing components and fixed hardwired circuit components.

The input device(s) 95 may be any one or more of the following: a touch input device, such as a keyboard, keypad, mouse, pen, touchscreen, touch pad, or trackball; a voice input device, such as a microphone transducer, speech-recognition software and processors; a scanning device; or another device, that provides input to the computing environment 90. For audio, the input device(s) 95 may include a microphone or other transducer (e.g., a sound card or similar device that accepts audio input in analog or digital form), or a computer-readable media reader that provides audio samples to the computing environment 90.

The output device(s) 96 may be any one or more of a display, printer, loudspeaker transducer, DVD-writer, or another device that provides output from the computing environment 90.

The communication connection(s) 97 enable communication over or through a communication medium (e.g., a connecting network) to another computing entity. A communication connection can include a transmitter and a receiver suitable for communicating over a local area network (LAN), a wide area network (WAN) connection, or both. LAN and WAN connections can be facilitated by a wired connection or a wireless connection. If a LAN or a WAN connection is wireless, the communication connection can include one or more antennas or antenna arrays. The communication medium conveys information such as computer-executable instructions, compressed graphics information, processed signal information (including processed audio signals), or other data in a modulated data signal. Examples of communication media for so-called wired connections include fiber-optic cables and copper wires. Communication media for wireless communications can include electromagnetic radiation within one or more selected frequency bands.

Machine-readable media are any available media that can be accessed within a computing environment 90. By way of example, and not limitation, with the computing environment 90, machine-readable media include memory 92, storage 94, communication media (not shown), and combinations of any of the above. Tangible machine-readable (or computer-readable) media exclude transitory signals.

As explained above, some disclosed principles can be embodied in a tangible, non-transitory machine-readable medium (such as microelectronic memory) having stored thereon instructions. The instructions can program one or more data processing components (generically referred to here as a "processor") to perform a processing operations described above, including estimating, computing, calculating, measuring, adjusting, sensing, measuring, filtering, addition, subtraction, inversion, comparisons, and decision making (such as by the control unit 52). In other embodiments, some of these operations (of a machine process) might be performed by specific electronic hardware components that contain hardwired logic (e.g., dedicated digital filter blocks). Those operations might alternatively be performed by any combination of programmed data processing components and fixed hardwired circuit components.

For sake of brevity throughout this disclosure, computing-environment components, processors, interconnections, features, devices, and media are generally referred to herein, individually, as a "logic component."

X. Working Embodiment

In a working embodiment, a pressure independent balancing and temperature control valve having two temperature and two pressure sensors was used to adjust/control flow through portions of a working cooling system. The pressure sensors are mounted on both sides of the valve allowing for flow measurement, and the temperature sensors are mounted on the supply and return manifold and are used to measure the differential temperature across the IT gear. Maximizing the ΔT can reduce the amount of pumping power required to keep the IT gear operating below its maximum temperature.

Once configured, this valve can operate autonomously, or can be connected to the BMS to report telemetry data including a BTU meter and flow meter. The valves can be configured to fully open, fully close or remain in a given position if a power or control communication failure is experienced.

As discussed above, benefits of a "smart" manifold and/or a "smart" cooling system include efficiency increases. By controlling flow at a per-rack level, the required pumping power can be reduced, the number of racks serviced by one CDU can be increased and there can be better resolution in assessments of how a given cluster is performing.

The amount of energy saved by disclosed principles can vary according to how IT workload is managed by the cluster. Substantial savings can be achieved when the rack is at a low IT workload. This can occur when, for example, the rack is idle, or when a given workload is IO intensive, but not computationally intensive, for example.

Figure 8:
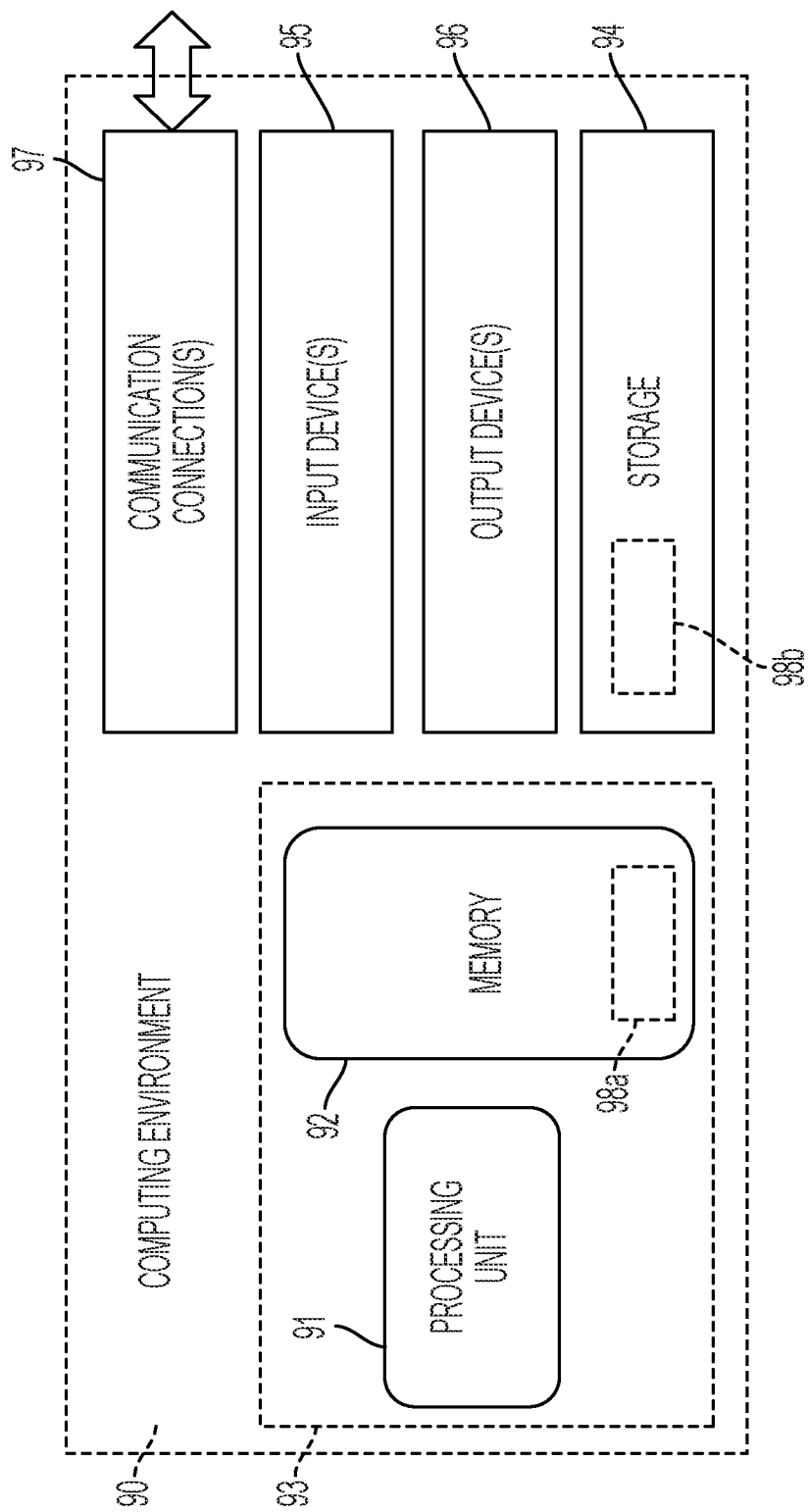
FIG. 8 shows a block diagram of a computing environment suitable for implementing disclosed methods.

For this example, consider a system that has the following configuration (or operating conditions: Tprimary=45 C; Qprimary=300 LPM; 15 racks, with 42 dual socket Skylake servers with a max TDP of 205 W; and Tcase,max=80 C. The system can be designed to cool the maximum TDP of 205 W with a 90% flow rate of the CHx750, which can deliver 0.74 LPM. This gives an expected Tcase for the first socket of 75.2 C and for the second socket, 79.2 C, as FIG. 8 shows.

Such a scenario can arise from IO intensive workloads where the CPUs are only operating at about 100 W of power consumption. In this case, the CDU pump speed can be reduced to 20%, for a flow rate of just 0.16 LPM per node. In this configuration under this load, CPUs will be at 68.7 C and 77.9 C respectively.

Figure 9:
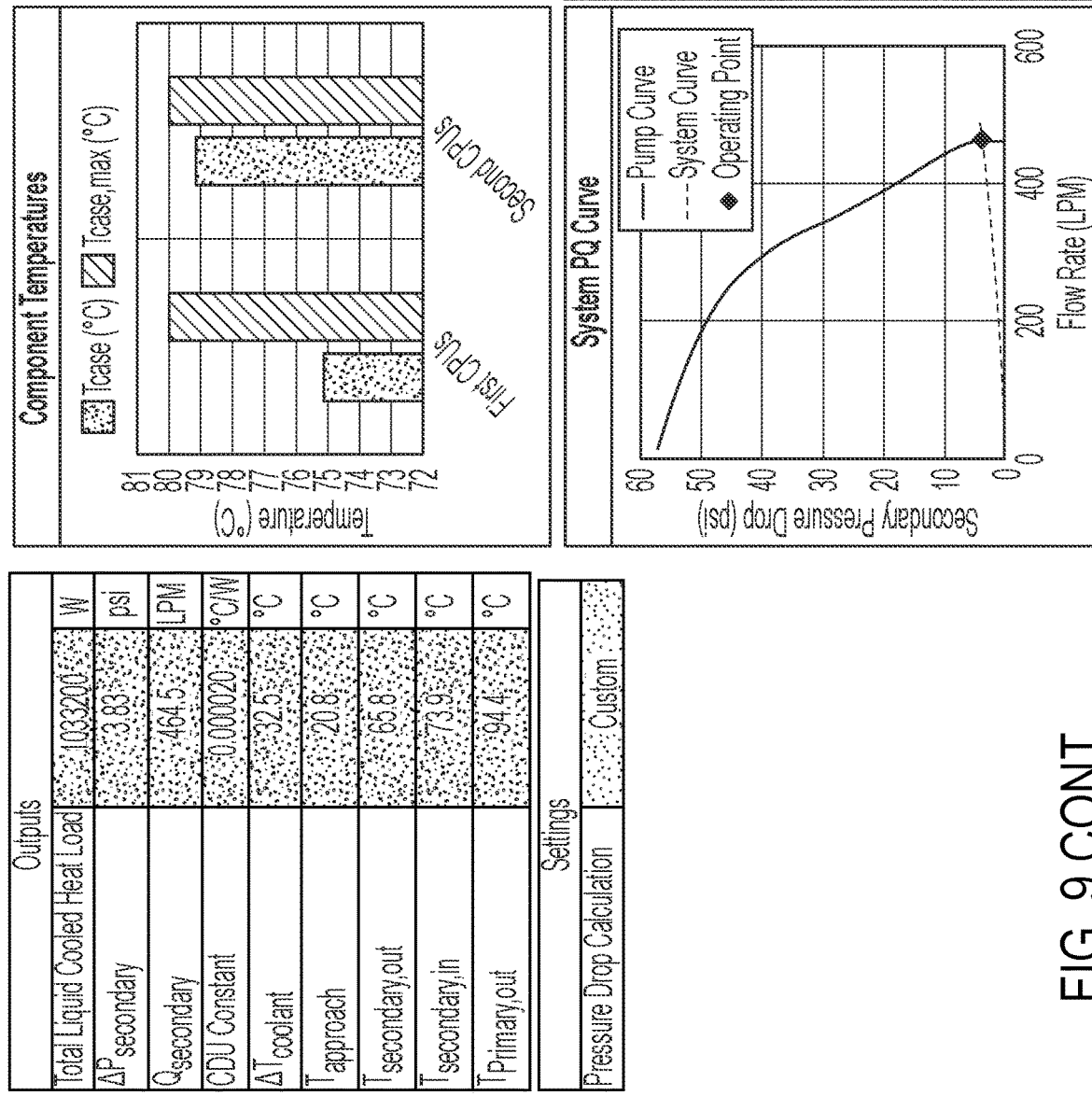
FIGS. 9 and 10 show operating conditions for a working example under different conditions.

The CDU pumps have been reduced by 70%, and the CDU power consumption drops from 4.1 kW to the minimum of 2.5 kW, a savings of approximately 40%. See FIG. 9.

As an alternative to electrical power savings, the number of racks supported by one CDU can be increased, which can reduce capital expenditures for a given installation. For example, using the same system parameters as above, the system can be designed to operate a pump at 100% of its rated speed to meet an upper threshold power dissipation (e.g., 100% thermal load), despite that the system is rarely being utilized to 100% of the upper threshold power dissipation. Instead of cooling a given system under such a high workload, an embodiment of a disclosed cooling system can adjust the coolant mass-flow rate according to the return temperature of coolant from each rack, diverting flow to the racks that need higher coolant mass-flow rate for higher cooling capacity.

Figure 10:
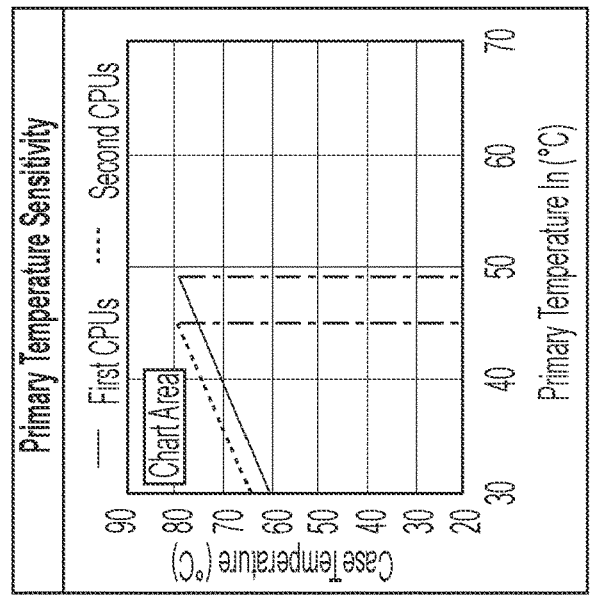
Figure 10:
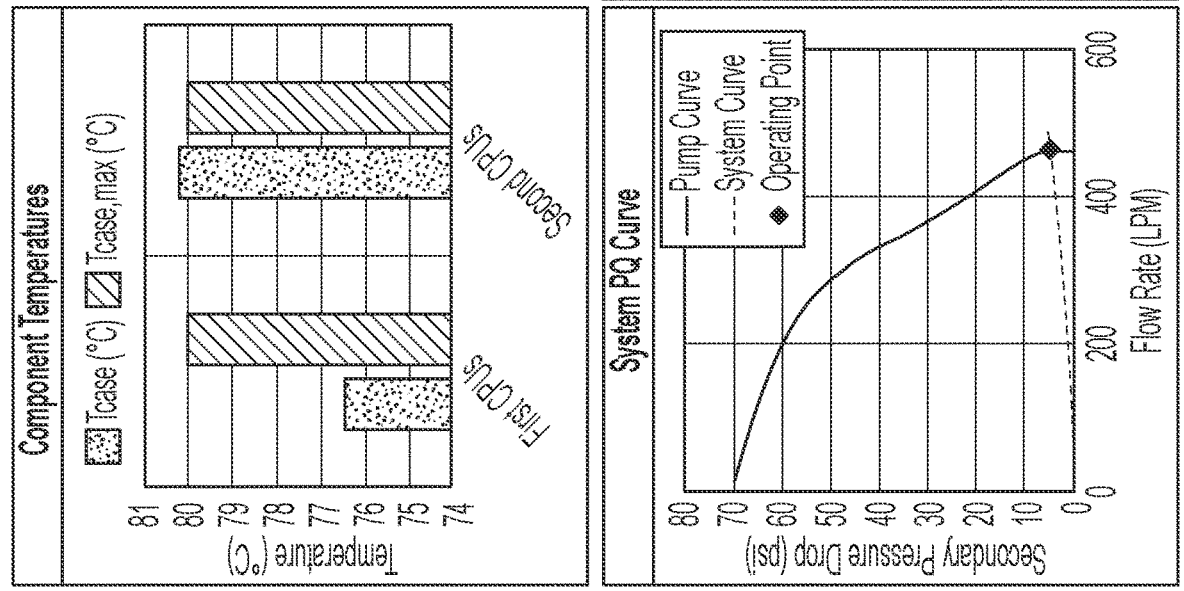
Figure 10:
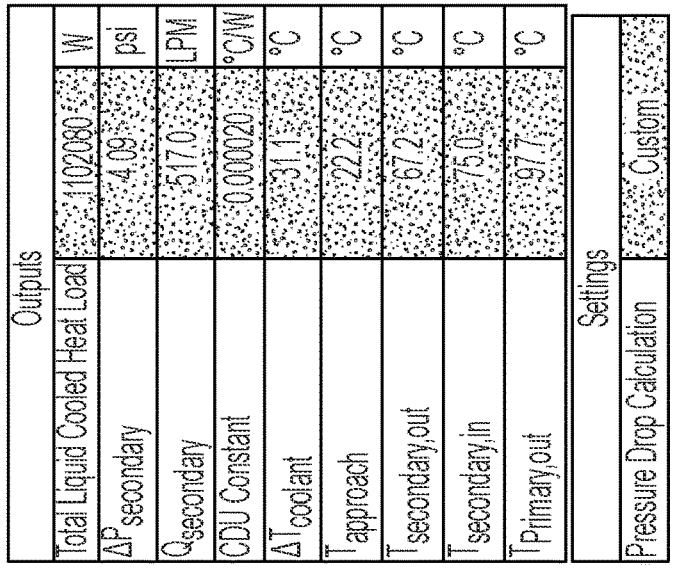

As shown in FIG. 10, an additional rack can be added while maintaining a component case temperature of about 76.3 and 80.2 C. Although this temperature may exceed an upper threshold temperature, this situation it is unlikely to occur in the field as a flow of coolant can be diverted from other racks under less load, either by a gateway or by the control logic 127/227.

Similarly, a leak detection system can be tied into the same DCIM/BMS to which the Smart Manifold is tied. This can allow for rack-level isolation when a leak is detected. In some embodiments, a flow-control valve (e.g., 112a-d, 212a-d) can incorporate a leak detection and/or an automatic server or rack isolation function. For example, the flow-control valve can automatically close on detection of a leak.

Co-location data centers can have different rack configurations. As these facilities adopt direct liquid cooling, they may find tailoring coolant mass-flow to a given server's IT workload to be desirable. Technologies disclosed herein can avoid the use of manual, mechanical flow setter valves that require an operator to manually adjust settings for each rack.

XI. Other Embodiments

The examples described above generally concern apparatus, methods, and related systems to tailor a cooling system's cooling capacity to an observed or predicted distribution of IT workload. Nonetheless, the previous description is provided to enable a person skilled in the art to make or use the disclosed principles. Embodiments other than those described above in detail are contemplated based on the principles disclosed herein, together with any attendant changes in configurations of the respective apparatus or changes in order of method acts described herein, without departing from the spirit or scope of this disclosure. Various modifications to the examples described herein will be readily apparent to those skilled in the art.

Directions and other relative references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, all patent and non-patent literature cited herein is hereby incorporated by reference in its entirety for all purposes.

And, those of ordinary skill in the art will appreciate that the exemplary embodiments disclosed herein can be adapted to various configurations and/or uses without departing from the disclosed principles. Applying the principles disclosed herein, it is possible to provide a wide variety of cooling nodes, and related methods and systems to tailor a cooling system's distribution of cooling capacity to an estimated or observed distribution of IT workload (or power dissipation). For example, the principles described above in connection with any particular example can be combined with the principles described in connection with another example described herein. Thus, all structural and functional equivalents to the features and method acts of the various embodiments described throughout the disclosure that are known or later come to be known to those of ordinary skill in the art are intended to be encompassed by the principles described and the features and acts claimed herein. Accordingly, neither the claims nor this detailed description shall be construed in a limiting sense, and following a review of this disclosure, those of ordinary skill in the art will appreciate the wide variety of cooling nodes, and related methods and systems to tailor a cooling system's distribution of cooling capacity to an estimated or observed distribution of IT workload (or power dissipation) that can be devised using the various concepts described herein.

Moreover, nothing disclosed herein is intended to be dedicated to the public regardless of whether such disclosure is explicitly recited in the claims. No claim feature is to be construed under the provisions of 35 USC 112(f), unless the feature is expressly recited using the phrase "means for" or "step for".

The appended claims are not intended to be limited to the embodiments shown herein, but are to be accorded the full scope consistent with the language of the claims, wherein reference to a feature in the singular, such as by use of the article "a" or "an" is not intended to mean "one and only one" unless specifically so stated, but rather "one or more". Further, in view of the many possible embodiments to which the disclosed principles can be applied, we reserve the right to claim any and all combinations of features and technologies described herein as understood by a person of ordinary skill in the art, including the right to claim, for example, all that comes within the scope and spirit of the foregoing description, as well as the combinations recited, literally and equivalently, in any claims presented anytime throughout prosecution of this application or any application claiming benefit of or priority from this application, and more particularly but not exclusively in the claims appended hereto.

We currently claim:

1. A heat-transfer system, comprising:
   a cooling circuit configured to convey heated coolant from one or more cooling nodes to one or more heat-rejection devices, and to convey the cooled coolant from the one or more heat-rejection devices to the one or more cooling nodes, wherein each cooling node facilitates a transfer of heat to the coolant, the heat being from one or more heat-dissipation devices and a corresponding heat load on the respective cooling node, and wherein each heat-rejection device facilitates heat transfer from the coolant to another medium;
   a selectively operable flow-control device configured to control a flow rate of the coolant through a segment of the coolant circuit; and
   a plurality of sensors and a control logic, the control logic configured to selectively operate the flow-control device responsive to an output from one or more of the plurality of sensors, said selective operation causing the heat-transfer system to tailor a cooling capacity available to each cooling node to the real-time heat load on the respective cooling node, wherein the coolant in the cooling circuit comprises a facility coolant and wherein at least one of the one or more cooling nodes comprises a coolant heat-exchange unit configured to transfer heat from a secondary coolant to the facility coolant, cooling the secondary coolant, the heat-transfer system further comprising:
   a secondary cooling circuit having a plurality of server-cooling nodes;
   a secondary distribution manifold configured to distribute the secondary coolant among the plurality of server-cooling nodes; and
   a secondary collection manifold configured to collect the secondary coolant from the plurality of server-cooling nodes, wherein the coolant heat-exchange unit fluidicly couples with the secondary collection manifold to receive heated secondary coolant from the plurality of server-cooling nodes and wherein the coolant heat-exchange unit fluidicly couples with the secondary distribution manifold to distribute cooled secondary coolant among the plurality of server-cooling nodes.

2. The heat-transfer system according to claim 1, wherein the coolant heat-exchange unit is a first coolant heat-exchange unit and the secondary cooling circuit is a first secondary cooling circuit, wherein the at least one of the one or more cooling nodes comprises a second coolant heat-exchange unit and wherein the heat-transfer system further comprises a second secondary cooling circuit cooled by the facility coolant.

3. The heat-transfer system according to claim 1, wherein at least one of the one or more cooling nodes comprises a component-cooling node corresponding to each of a plurality of servers, each component-cooling node being configured to transfer heat from a processing unit to the secondary coolant.

4. The heat-transfer system according to claim 1, wherein the selectively operable flow-control device comprises an adjustable valve.

5. The heat-transfer system according to claim 1, wherein the selectively operable flow-control device comprises a controllable pump.

6. The heat-transfer system according to claim 1, wherein the one or more heat-rejection devices comprises a waste-heat recovery device configured to transfer heat from the coolant to another working fluid.

7. The heat-transfer system according to claim 1, further comprising a gateway having a first communication connection with the control logic, the plurality of sensors, or both, and a second communication connection with a Data Center Information Manager, a Building Management System, or both, the gateway being configured to receive first information over the first communication connection and to communicate the received first information over the second communication connection, to receive second information over the second communication connection and to communicate the received second information over the first communication connection, or both.

8. The heat-transfer system according to claim 7, wherein the first received information corresponds to a measure of cooling margin available from the heat-transfer system.

9. The heat-transfer system according to claim 7, wherein the second received information corresponds to an IT workload scheduled for one or more servers, wherein the heat load on the respective cooling node corresponds to the IT workload.

10. A heat-transfer system, comprising:
    a plurality of cooling nodes, each cooling node configured to transfer heat to a coolant, the transferred heat generated by one or more electronic components corresponding to each cooling node;
    a flow controller configured to control a flow rate of coolant to a selected one or more of the plurality of cooling nodes in correspondence with a real-time determination of the heat generated by the one or more electronic components corresponding to the selected one or more of the plurality of cooling nodes;
    a communication gateway configured to receive information from the flow controller and to communicate the information to a Building Management System, a Data Center Information Manager, or both, and wherein the communication gateway is further configured to receive information from the Building Management System, the Data Center Information Manager, or both and to communicate the information to the flow controller, wherein the flow controller is configured to isolate one of the one or more of the plurality of cooling nodes responsive to selected information received from the communication gateway.

11. The heat-transfer system according to claim 10, further comprising a plurality of sensors, each sensor in the first plurality of sensors being configured to observe a corresponding one or more parameters of a selected one of the plurality of cooling nodes, wherein the communication gateway is configured to determine a state of-operational-health of the selected cooling node from the one or more parameters observed by the plurality of sensors and to communicate an indication of the state of-operational-health to the Building Management System, the Data Center Information Manager, or both.

12. The heat-transfer system according to claim 10, wherein the flow controller is further configured to control the flow rate of coolant to the selected one or more of the plurality of cooling nodes responsive to information received from the communication gateway.

13. The heat-transfer system according to claim 10, wherein the information received from the communication gateway corresponds to information received by the gateway from from the Building Management System, the Data Center Information Manager, or both.

14. The heat-transfer system according to claim 10, wherein real-time determination of the generated heat corresponds to information received from the Building Management System, the Data Center Information Manager, or both.

15. The heat-transfer system according to claim 10, wherein the flow controller comprises a control logic and a flow-control device.

16. The heat-transfer system according to claim 10, wherein the flow controller comprises a valve, a pump, or both.

* * * * *